(12) United States Patent
Kajiwara et al.

(10) Patent No.: US 6,429,633 B1
(45) Date of Patent: *Aug. 6, 2002

(54) SWITCHING REGULATOR AND LSI SYSTEM

(75) Inventors: Jun Kajiwara, Kyoto; Katsuji Satomi, Osaka; Shiro Sakiyama, Osaka; Masayoshi Kinoshita, Osaka; Katsuhiro Ootani, Nara, all of (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/530,267

(22) PCT Filed: Aug. 27, 1999

(86) PCT No.: PCT/JP98/04627

§ 371 (c)(1),
(2), (4) Date: Apr. 28, 2000

(87) PCT Pub. No.: WO00/13318

PCT Pub. Date: Mar. 9, 2000

(30) Foreign Application Priority Data

Aug. 28, 1998 (JP) ............................................ 10-243147

(51) Int. Cl.[7] .............................. G05F 1/40; A02M 7/00; H03R 17/16
(52) U.S. Cl. ........................ 323/282; 323/283; 363/70; 327/391
(58) Field of Search ................................ 323/222, 272, 323/282, 283, 284, 285; 363/70, 21, 72, 65, 127, 132; 307/491; 219/130.51; 327/391

(56) References Cited

U.S. PATENT DOCUMENTS

| | | | | |
|---|---|---|---|---|
| 4,039,925 A | * | 8/1977 | Fletcher et al. | 363/70 |
| 4,315,307 A | | 2/1982 | Jacquart | |
| 4,521,672 A | * | 6/1985 | Fronius | 219/130.33 |
| 5,757,173 A | * | 5/1998 | Agiman | 323/282 |
| 5,894,281 A | * | 4/1999 | Toda | 341/154 |
| 6,020,729 A | * | 2/2000 | Stratakos et al. | 323/283 |

FOREIGN PATENT DOCUMENTS

| | | |
|---|---|---|
| EP | 0 340 731 A2 | 11/1989 |
| EP | 0 443 155 A1 | 8/1991 |
| EP | 0581 016 A1 | 2/1994 |
| EP | 0 648 020 A2 | 4/1995 |
| EP | 0 768 761 A2 | 4/1997 |
| JP | 8-149826 | 6/1996 |
| JP | 8-107344 | 11/1996 |
| JP | 9-285120 | 10/1997 |

* cited by examiner

*Primary Examiner*—Rajnikant D. Patel
(74) *Attorney, Agent, or Firm*—Nixon Peabody LLP; Donald R. Seudebaker

(57) ABSTRACT

In a switching regulator, switching noise is reduced with keeping high conversion efficiency. The switching regulator includes plural output switching transistors 21 through 23 having different on-resistances, which are operated nadescending order of on-resistance in the on operation and are operated in an ascending order of on-resistance in the off operation. In this manner, abrupt current change can be suppressed in the switching operation, resulting in reducing di/dt noise derived from a parasitic inductor 102.

23 Claims, 19 Drawing Sheets

SWITCHING REGULATOR AND LSI SYSTEM

TECHNICAL FIELD

The present invention relates to a technique concerning a switching regulator, and more particularly, it relates to a technique to reduce switching noise.

BACKGROUND ART

Recently, portable electronic equipment such as a portable telephone and a notebook personal computer has been remarkably spread. With the spread of such equipment, a technique to reduce power consumption has become indispensable in the field of semiconductor technology. In order to suppress the power consumption of an LSI, it is effective to reduce the power-supply voltage of the LSI itself, and for this purpose, a highly efficient power-supply voltage converting circuit is necessary.

A switching regulator is known to have much higher efficiency than a linear regulator due to its operation principle, and various systems for a switching regulator have been studied and developed. In accordance with increase of the operation speed and decrease of the power consumption of an LSI, there are increasing demands for a switching regulator with higher efficiency and higher switching speed.

FIG. 18 is a diagram for showing a basic circuit configuration of a conventional switching regulator, that is, a synchronous rectifiable buck switched-mode power-supply (DC/DC converter). A DC power-supply 1 is a source for generating the output of this switching regulator, and is a target to be chopped. The DC power-supply 1 is connected, at its power-supply port, to the source terminal of an output switching transistor 2 constructed from a P-type MOS transistor, and is connected, at its GND port, to the source terminal of a rectifier switching transistor 3 constructed from an N-type MOS transistor.

FIG. 19 is a timing chart for showing the operation of the switching regulator of FIG. 18. A controller 5 compares an output voltage Vout with a reference voltage Vref, and controls on/off operations of the switching transistors 2 and 3 on the basis of the result of the comparison. A voltage comparator 4 compares the output voltage Vout with the reference voltage Vref, and a pulse generating circuit 6 outputs a pulse signal SC for controlling the on/off operations on the basis of the result of the comparison. The signal SC is supplied to gate driving buffers 8 and 9 of the switching transistors 2 and 3. The drain voltage VD of each of the switching transistors 2 and 3 is chopped by the on/off operation of the switching transistor 2 or 3 and a diode 11, and the chopped voltage is smoothed by a smoothing circuit 10 including an inductance device 12 and a capacitor 13, so as to be output as the output voltage Vout. The conversion efficiency is defined as follows:

Conversion efficiency=(Output power)/(Input power)

Problems to be Solved by the Invention

In order to keep high conversion efficiency in the conventional switching regulator, it is necessary to optimize a switching size by decreasing the on-resistances of the switching transistors 2 and 3 as much as possible, or/and to decrease an AC loss by increasing a switching frequency so as to conduct rapid switching. There arises, however, a problem that the rapid switching causes large switching noise.

Specifically, there exists a so-called parasitic inductor 102 on a power-supply line as is shown in FIG. 18. When the source-drain voltage VDS of the switching transistors 2 and 3 is large, abrupt current change caused by the switching operation leads to occurrence of di/dt noise derived from the parasitic inductor 102. This noise fluctuates the power-supply voltage level in every switching operation, resulting in causing similar noise also in the output voltage Vout. As a result, L·di/dt switching noise derived from the parasitic inductor 102 of the power-supply line is unavoidably caused in the output voltage Vout.

In order to reduce such switching noise, for example, a capacity inserting resonant switching regulator is conventionally used. The resonant switching regulator conducts ZVC (zero voltage switching) by utilizing LC resonance. The resonant switching regulator, however, has a problem of a very complicated configuration of its control circuit and is difficult to timely control. Furthermore, this resonant switching regulator has another problem that as the output current is larger, the AC loss is larger, resulting in decreasing the conversion efficiency.

Disclosure of the Invention

An object of the invention is reducing switching noise of a switching regulator while keeping high conversion efficiency.

Specifically, the switching regulator of this invention comprises plural output switching transistors operated in a predetermined order in at least one of an on operation and an off operation thereof.

According to the invention, the plural output switching transistors are operated in the predetermined order in at least one of the on operation and the off operation thereof. As a result, abrupt current change can be suppressed in the switching operation. Accordingly, di/dt noise derived from a parasitic inductor can be reduced.

In the switching regulator, the plural output switching transistors are preferably turned on in a descending order of on-resistance in the on operation thereof, and the plural output switching transistors are preferably turned off in an ascending order of on-resistance in the off operation thereof.

In the switching regulator, the plural output switching transistors are preferably turned on in an ascending order of transistor width in the on operation thereof, and the plural output switching transistors are preferably turned off in a descending order of transistor width in the off operation thereof.

In the switching regulator, one of the plural output switching transistors that is turned on first preferably has a drain current value in a non-saturation region larger than a maximum load current value of the switching regulator.

Preferably, in the switching regulator, the plural output switching transistors are divided into plural groups, and in the on operation thereof, the plural output switching transistors are turned on by group in an ascending order of the number of output switching transistors belonging to each group, and in the off operation thereof, the plural output switching transistors are turned off by group in a descending order of the number of output switching transistors belonging to each group.

The switching regulator preferably further comprises plural driving circuits provided correspondingly to the plural output switching transistors each for operating a corresponding one of the output switching transistors in accordance with a driving signal thereof, and at least one of the plural driving circuits preferably includes an inverter for driving a gate of the corresponding one of the out put switching transistors in accordance with the driving signal; and a constant current source circuit for controlling a current flowing through the inverter to be constant.

The at least one of the plural driving circuits preferably includes a current controlling circuit for controlling, in accordance with a load current quantity of the switching regulator, an amplitude of the current flowing through the inverter controlled by the constant current source circuit. Also, the at least one of the plural driving circuits preferably includes a non-overlap circuit that receives the driving signal and supplies a signal to the inverter for preventing a P-type MOS transistor and an N-type MOS transistor included in the inverter from being in an on state at the same time.

In the switching regulator, one of the plural output switching transistors having a comparatively large size is preferably placed comparatively closer to I/O pads of an LSI including the switching regulator and another of the plural output switching transistors having a comparatively small size is preferably placed comparatively farther from the I/O pads of the LSI.

Furthermore, the switching regulator preferably further comprises a timing setting circuit provided correspondingly to at least one of the plural output switching transistors, the timing setting circuit setting timing of turning on or off the corresponding one of the output switching transistors in accordance with a load current value of the switching regulator.

Moreover, the switching regulator preferably further comprises plural rectifier switching transistors operated in a predetermined order in at least one of an on operation and an off operation thereof. Additionally, the plural rectifier switching transistors are preferably turned on in a descending order of on-resistance in the on operation thereof, and the plural rectifier switching transistors are preferably turned off in an ascending order of on-resistance in the off operation thereof.

Furthermore, the switching regulator preferably further comprises plural driving circuits provided correspondingly to the plural rectifier switching transistors each for operating a corresponding one of the plural rectifier switching transistors in accordance with a driving signal thereof, and at least one of the plural driving circuits preferably includes an inverter for driving a gate of the corresponding one of the rectifier switching transistors in accordance with the driving signal; and a constant current source circuit for controlling a current flowing through the inverter to be constant.

Moreover, the switching regulator preferably further comprises a timing setting circuit provided correspondingly to at least one of the plural rectifier switching transistors for setting timing of turning on or off the corresponding one of the output switching transistors in accordance with a load current value of the switching regulator.

Also, the switching regulator preferably further comprises a logic circuit for preventing the plural rectifier switching transistors from turning on when at least one of the plural output switching transistors is in an on state.

Also, the switching regulator preferably further comprises a controller for controlling the on operation and the off operation of the plural output switching transistors, and in the on operation of the plural output switching transistors, the controller turns on one of the output switching transistors that is to be turned on first, and the rest of the output switching transistors are successively turned on in accordance with change of a gate signal of any of the output switching transistors that is turned on immediately before, and in the off operation of the plural output switching transistors, the controller turns off one of the output switching transistors that is to be turned off first, and the rest of the output switching transistors are successively turned off in accordance with change of a gate signal of any of the output switching transistors that is turned off immediately before.

In addition, the switching regulator preferably further comprises plural rectifier switching transistors operated in a predetermined order in an on operation and an off operation thereof, and in the on operation of the plural output switching transistors, the controller turns off one of the rectifier switching transistors that is to be turned off first, and the rest of the rectifier switching transistors are successively turned off in accordance with change of a gate signal of any of the rectifier switching transistors that is turned off immediately before, and one of the output switching transistors that is to be turned on first is turned on in accordance with change of agate signal of any of the rectifier switching transistors that is turned off lastly, and the rest of the output switching transistors are successively turned on in accordance with change of a gate signal of any of the output switching transistors that is turned on immediately before; and in the off operation of the plural output switching transistors, the controller turns off one of the output switching transistors that is to be turned off first, and the rest of the output switching transistors are successively turned off in accordance with change of a gate signal of any of the output switching transistors that is turned off immediately before, and one of the rectifier switching transistors that is to be turned on first is turned on in accordance with change of a gate signal of any of the output switching transistors that is turned off lastly, and the rest of the rectifier switching transistors are successively turned on in accordance with change of a gate signal of any of the rectifier switching transistors that is turned on immediately before.

Alternatively, the LSI system of this invention comprises the switching regulator of this invention; and an LSI core cart operated by a voltage supplied from the switching regulator.

BEST MODE FOR CARRYING OUT THE INVENTION

Embodiment 1

Figure 1:
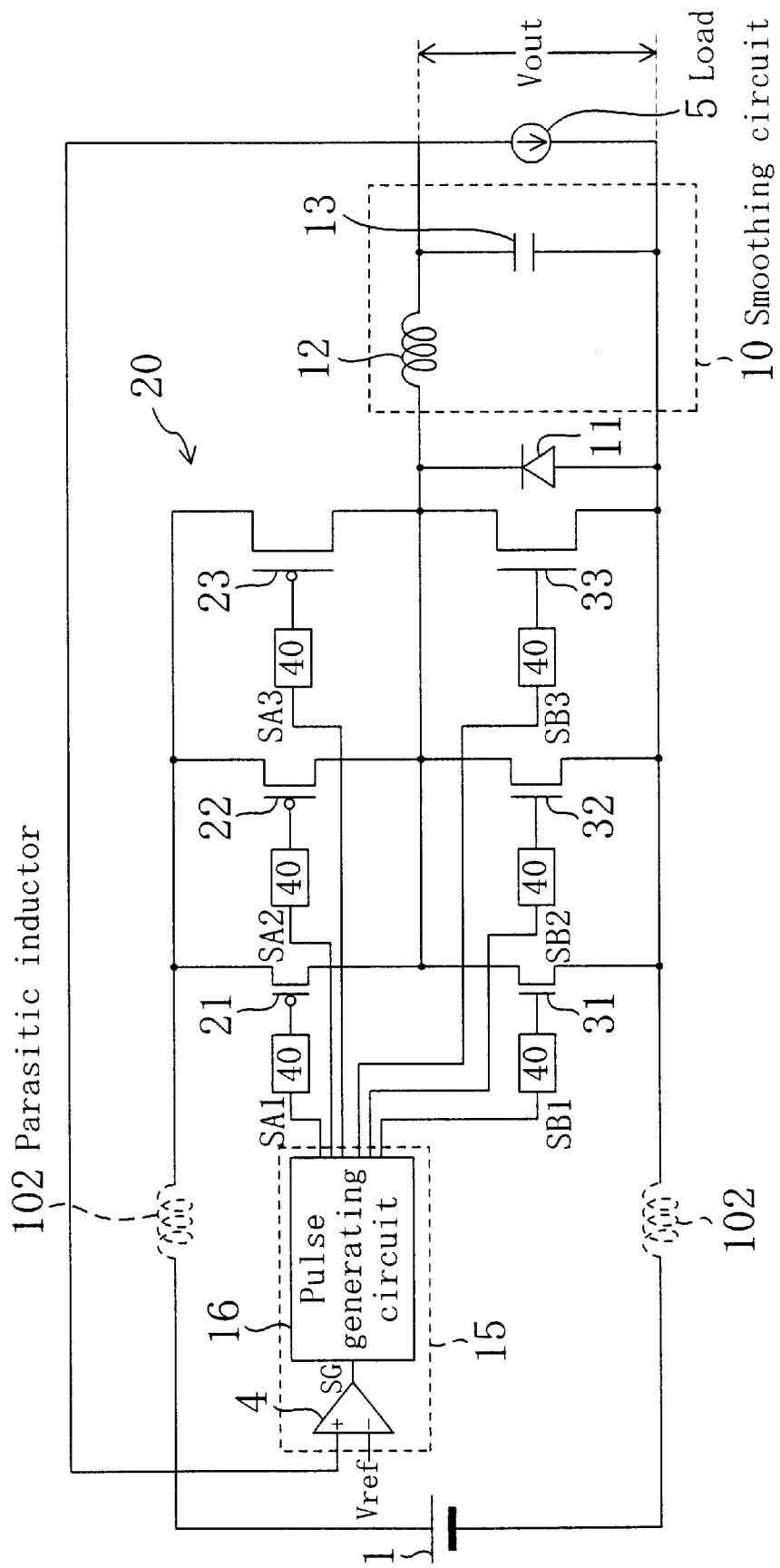
FIG. 1 is a diagram for showing the configuration of a switching regulator according to Embodiment 1 of the invention.

FIG. 1 is a diagram for showing the configuration of a switching regulator of Embodiment 1 of the invention. The switching regulator of FIG. 1 is a synchronous rectifiable buck switched-mode regulator (DC/DC converter).

A DC power-supply 1 is a source for generating the output of the switching regulator. The DC power-supply 1 is connected, at its power-supply port, to the source terminals of plural output switching transistors 21, 22 and 23 each constructed from a P-type MOS transistor, and is connected, at its GND port, to the source terminals of plural rectifier switching transistors 31, 32 and 33 each constructed from an N-type MOS transistor. The drain terminals of the output switching transistors 21, 22 and 23 and the rectifier switching transistors 31, 32 and 33 are connected to a diode 11 and a smoothing circuit 10 including an inductance device 12 and a capacitor 13.

A controller 15 controls the on/off operations of the switching transistors 21 through 23 and 31 through 33 in accordance with an output voltage Vout of the switching regulator output from the smoothing circuit 10. In the controller 15, a voltage comparator 4 compares the output voltage Vout with a reference voltage Vref and outputs a signal SG corresponding to the result of the comparison. In response to the signal SG, a pulse generating circuit 16 outputs signals SA1 through SA3 and SB1 through SB3 for respectively controlling the on/off operations of the switching transistors 21 through 23 and 31 through 33.

A driving circuit 40 is provided to each of the switching transistors 21 through 23 and 31 through 33. Each driving circuit 40 receives the output signal SA1, SA2, SA3, SB1, SB2 or SB3 of the controller 15 as a driving signal for driving the corresponding switching transistor 21, 22, 23, 31, 32 or 33. The voltage at the drain terminal of each of the switching transistors 21 through 23 and 31 through 33 is smoothed by the smoothing circuit 10 to be output as the output voltage Vout.

The respective output switching transistors 21 through 23 have different transistor widths, which become larger in the order of the switching transistors 21, 22 and 23 (21<22<23). As a result, the on-resistances thereof are larger in the order of the switching transistors 23, 22 and 21 (23<22<21). Similarly, the respective rectifier switching transistors 31 through 33 have different transistor widths, which become larger in the order of the rectifier switching transistors 31, 32 and 33 (31<32<33). As a result, the on-resistances thereof are larger in the order of the rectifier switching transistors 33, 32 and 31 (33<32<31). in this embodiment, the plural output switching transistors 21 through 23 and the plural rectifier switching transistors 31 through 33 are operated in a predetermined order in their on and off operations. Thus, a current can be prevented from abruptly changing in the switching operation, so as to reduce switching noise.

Figure 2:
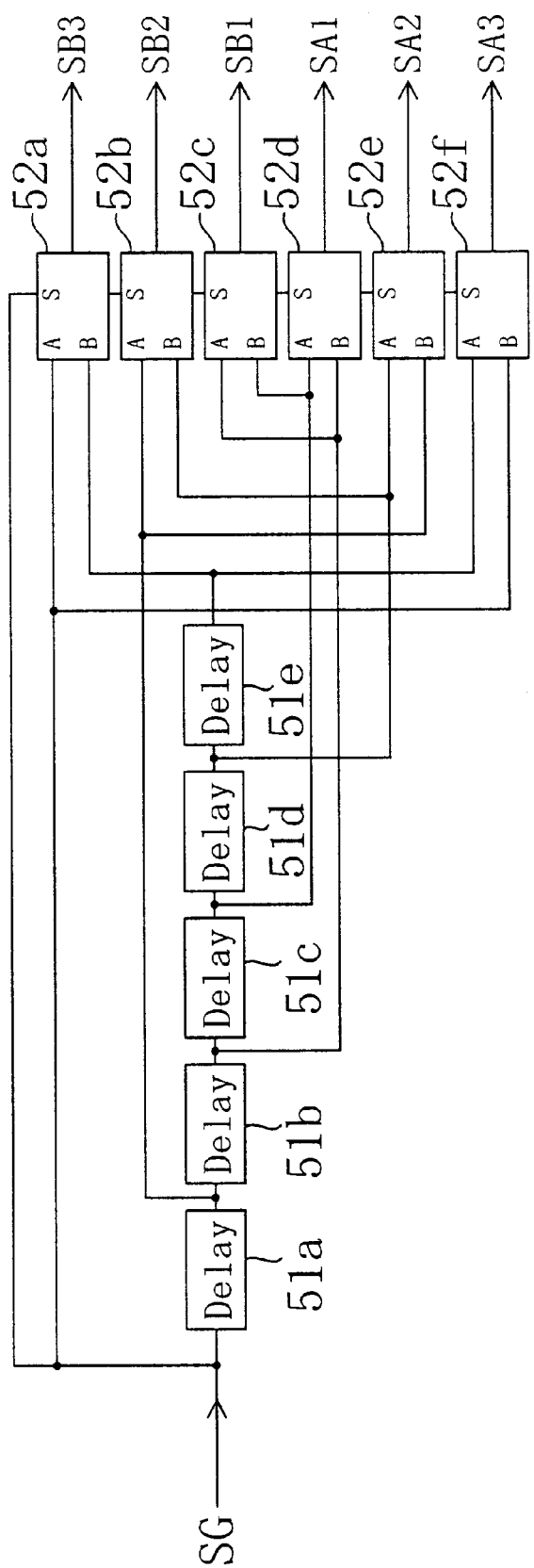
FIG. 2 is a diagram for showing the internal configuration of a pulse generating circuit 16 of FIG. 1.
Figure 3:
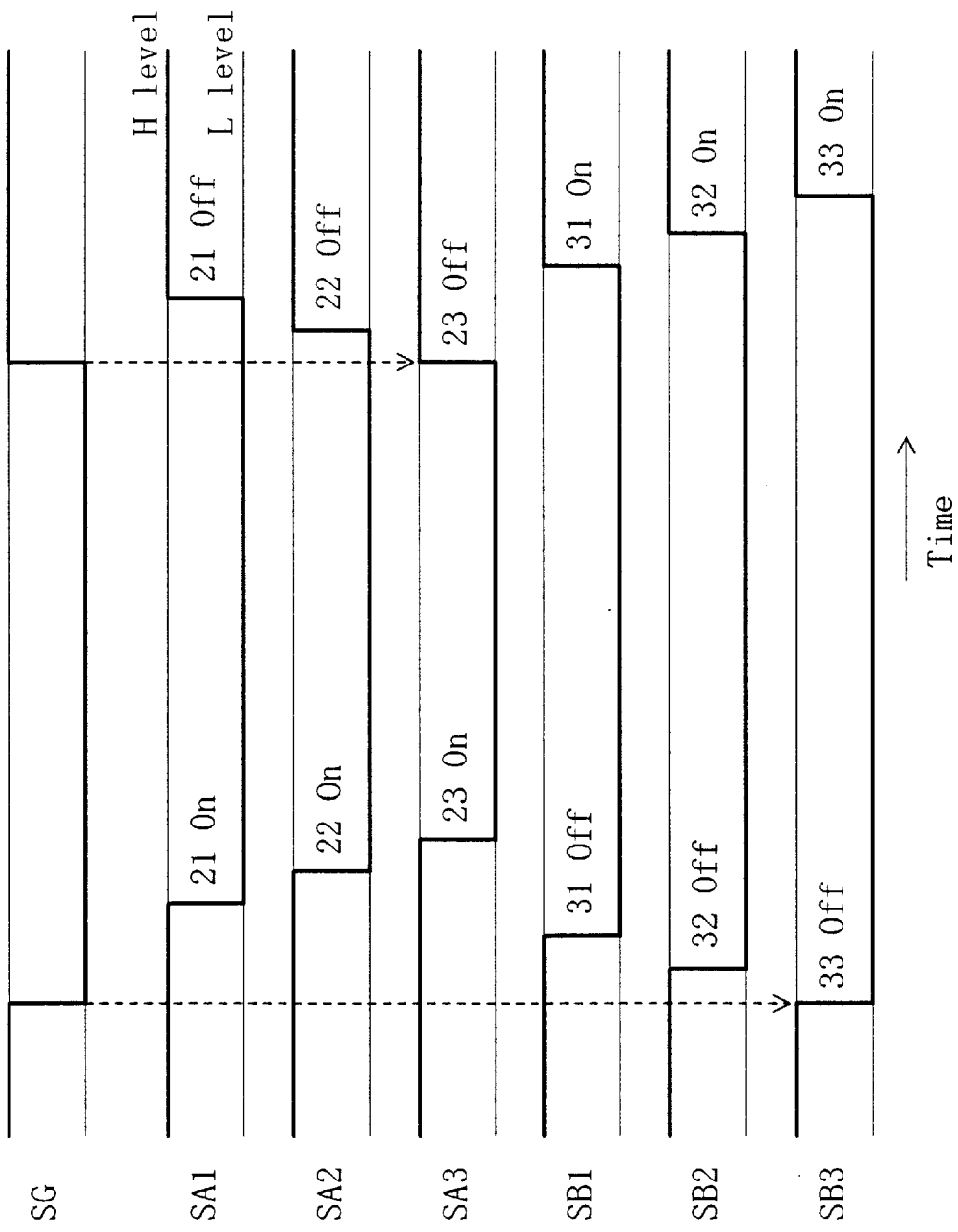
FIG. 3 is a diagram for showing change with time of signals SG, SA1 through SA3 and SB1 through SB3 in the configuration of FIG. 1.

FIG. 2 is a diagram for showing the internal configuration of the pulse generating circuit 16, and FIG. 3 is a diagram for showing change with time of the output signal SG of the voltage comparator 4 and the output signals SA1 through SA3 and SB1 through SB3 of the pulse generating circuit 16.

As is shown in FIG. 3, at a fall of the signal SG, the respective signals SA1 through SA3 and SB1 through SB3 successively fall in a predetermined order. When it is herein assumed that the logic of the signal is not inverted in each driving circuit 40, the output switching transistors 21 through 23, that is, the P-type MOS transistors, conduct the on operation in response to the falls of the signals SA1 through SA3, and the rectifier switching transistors 31 through 33, that is, the N-type MOS transistors, conduct the off operation in response to the falls of the signals SB1 through SB3. On the other hand, at a rise of the signal SG, the respective signals SA1 through SA3 and SB1 through SB3 successively rise in a predetermined order. As are result, the output switching transistors 21 through 23 conduct the off operation and the rectifier switching transistors 31 through 33 conduct the on operation.

In the on operation, the output switching transistors 21 through 23 are operated in accordance with the signals SA1 through SA3 in the ascending order of transistor width, namely, in the descending order of on-resistance. Specifically, the output switching transistor 21 having the smallest transistor width is turned on first, the output switching transistor 22 is turned on next, and the output switching transistor 23 having the largest transistor width is turned on lastly. On the other hand, in the off operation, the output switching transistors 21 through 23 are operated in the descending order of transistor width, namely, in the ascending order of on-resistance. Specifically, the output switching transistor 23 having the largest transistor width is turned on first, the output switching transistor 22 is turned on next, and the output switching transistor 21 having the smallest transistor width is turned on lastly.

Similarly, in the on operation, the rectifier switching transistors 31 through 33 are operated in accordance with the signals SB1 through SB3 in the ascending order of transistor width, namely, in the descending order of on-resistance (31→32→33). on the other hand, in the off operation, the rectifier switching transistors 31 through 33 are operated in the descending order of transistor width, namely, in the ascending order of on-resistance (33→32→31)

Such switching operations can suppress the abrupt change of the drain current, resulting in reducing the L·di/dt noise derived from a parasitic inductor 102.

Figure 4:
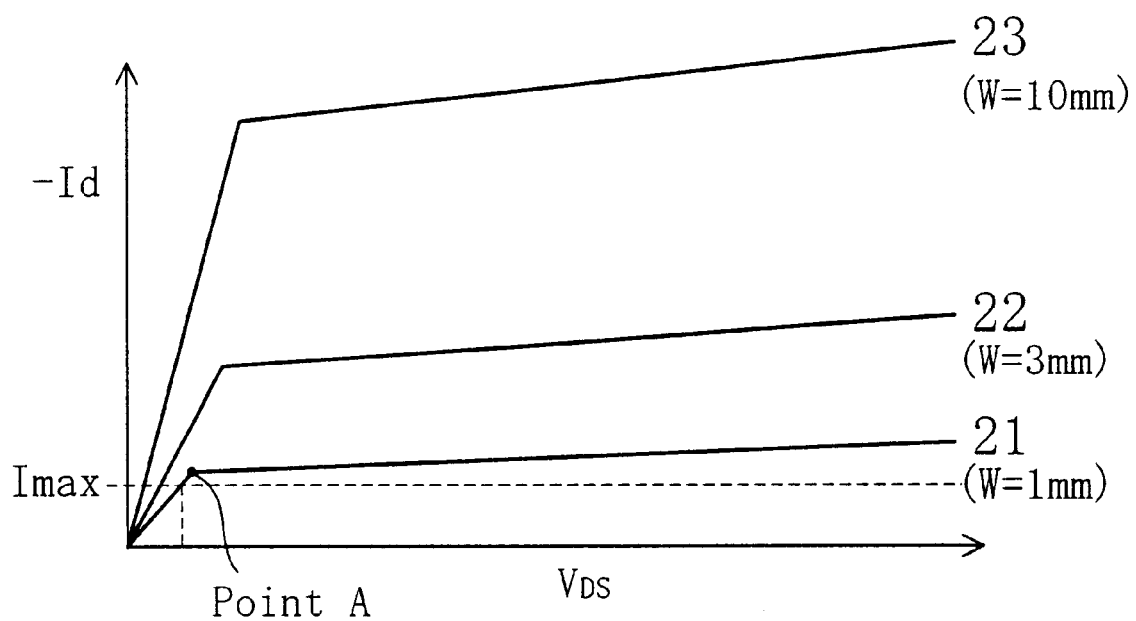
FIG. 4 is a diagram for showing the characteristics of output switching transistors 21 through 23 of FIG. 1.

Next, determination of the transistor widths of the plural switching transistors 20 of this embodiment will be described. FIG. 4 is a diagram for showing the characteristics of the output switching transistors 21 through 23. In FIG. 4, it is assumed for the sake of understanding that the gate potentials of the respective output switching transistors 21 through 23 are set to fall at the same time.

First, the total size, namely, the total transistor width, of the plural output switching transistors is determined. In order to attain high conversion efficiency in a switching regulator, it is preferred that the on-resistance of each output switching transistor is as small as possible. In order to reduce the on-resistance, it is necessary to increase the transistor width, and hence, there is a trade-off relationship between the high efficiency and the area of the transistor. Also, when the transistor width is large, the parasitic capacitance of the transistor is increased, which elongates response time of the transistor serving as a switching device. Therefore, large switching loss and charge/discharge loss are caused by the switching device itself during the on/off operation.

Accordingly, the size determination of an output switching transistor is a significant factor in the design of a highly efficient switching regulator, and it is necessary to select an optimal size in consideration of the above-described matters. After the total size of the output switching transistors is determined, the transistor width of each switching transistor is determined.

First, the transistor width of the output switching transistor 21 at the first stage is determined so that a drain current value in a non-saturation region of the drain voltage-current characteristic can be larger than the maximum load current value to be output by the switching regulator. In FIG. 4, a point A corresponds to a boundary between a non-saturation region and a saturation region in the characteristic of the output switching transistor 21, and a current value at the point A is larger than the maximum load current value Imax of the switching regulator. Herein, the transistor width of the output switching transistor 21 is determined as, for example, 1 mm. in the case where the output switching transistor 21 at the first stage alone is in an on state, if the load current value of the switching regulator is larger than the drain current of the output switching transistor 21 at the first stage, the supply current from the diode 11 is large. When the output switching Transistor 22 at the next stage is turned on under this condition, abrupt current change is caused, which causes the noise. In order to prevent this noise, it is preferred that the output switching transistor 21 at the first stage is constructed to have a drain current in the non-saturation region of its characteristic larger than the maximum load current value of the switching regulator.

Next, with respect to the output switching transistor 22 at the next stage, a switching interval is set so that the output switching transistor 22 can be turned on when the characteristic of the output switching transistor 21 reaches the non-saturation region from the saturation region. Then, the transistor width of the output switching transistor 22 is determined so that a time change ratio of a drain current, di/dt, can be constant at a drain-source voltage VDS attained when the characteristic of the output switching transistor 21 at the first stage reaches the non-saturation region from the saturation region. Herein, the transistor width of the output switching transistor 22 is determined as, for example, 3 mm.

Furthermore, with respect to the output switching transistor 23 at the subsequent stage, the transistor width is determined so that the time change ratio of a drain current, di/dt, can be constant when it is turned on. Herein, the transistor width of the output switching transistor 23 is determined as, for example, 10 mm.

Also with respect to the rectifier switching transistors 31 through 33, the transistor widths can be determined in the same manner as described above.

In this manner, according to this embodiment, the plural output switching transistors are successively turned on in the descending order of on-resistance and turned off in the ascending order of on-resistance, and the transistor widths of the output switching transistors are optimized so as to make substantially constant the time change ratio of the current, di/dt. Accordingly, the abrupt current change can be prevented in the switching operation of the output switching transistors, resulting in reducing the noise derived from the parasitic inductor.

Although both the output switching transistors and the rectifier switching transistors are provided at plural stages in this embodiment, the rectifier switching transistors are not necessarily provided at the plural stages. The effect to reduce the switching noise can be achieved even when the output switching transistors alone are provided at the plural stages. However, by providing plural rectifier switching transistors, the noise can be reduced more effectively.

Also, the output switching transistors or the rectifier switching transistors can be operated in the predetermined order merely in either the on operation or the off operation.

Alternatively, the on-resistances of the output switching transistors and the rectifier switching transistors can be differently set by using a factor other than the transistor width.

Figure 5:
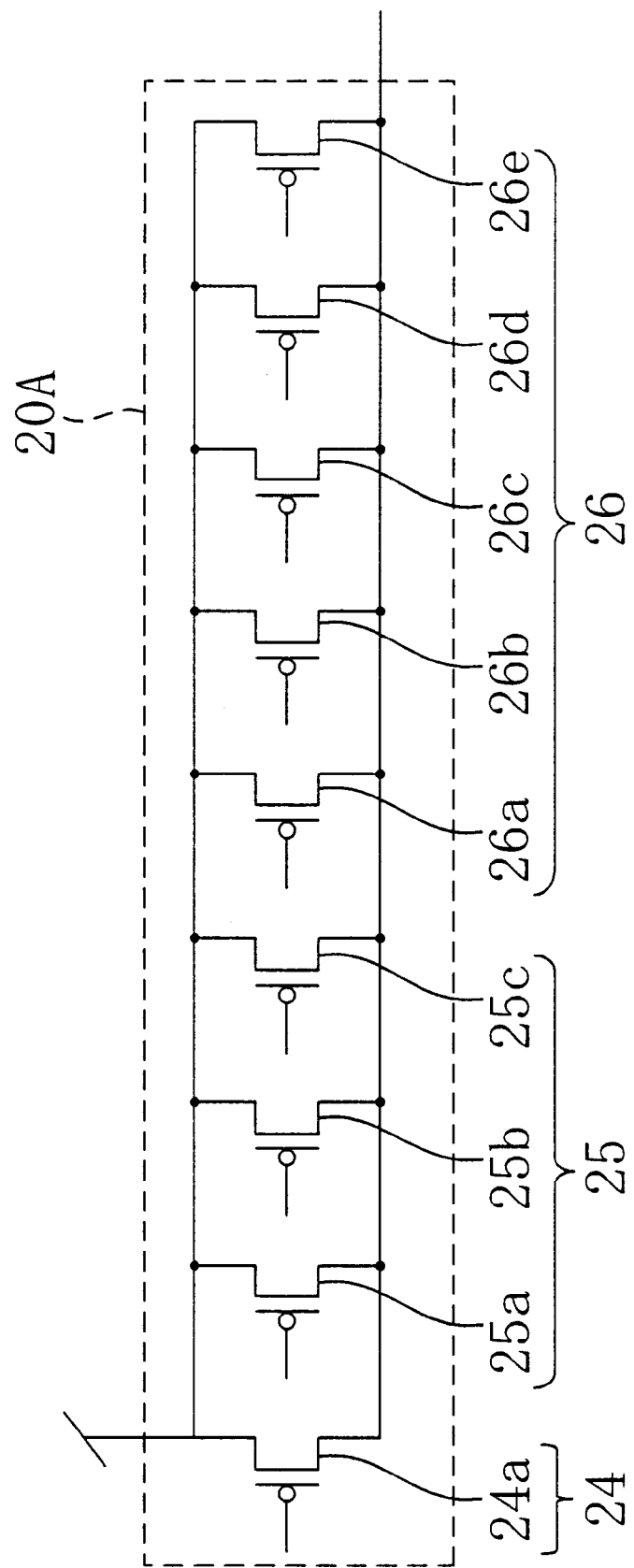
FIG. 5 is a diagram for showing another configuration of plural output transistors.

FIG. 5 shows another exemplified configuration of the plural output switching transistors. The plural output switching transistors 20A of FIG. 5 includes eight transistors with an equal transistor width divided into three groups. Specifically, a first group 24 consists of a transistor 24a, a second group 25 consists of transistors 25a through 25c, and a third group 26 consists of transistors 26a through 26e.

In this case, the controller 15 turns on or off the plural output switching transistors 20A by group. Specifically, the transistor 24a of the first group 24 is controlled in accordance with the signal SA1, the transistors 25a through 25c of the second group 25 are controlled in accordance with the signal SA2, and the transistors 26a through 26e of the third group 26 are controlled in accordance with the signal SA3.

Figure 6:
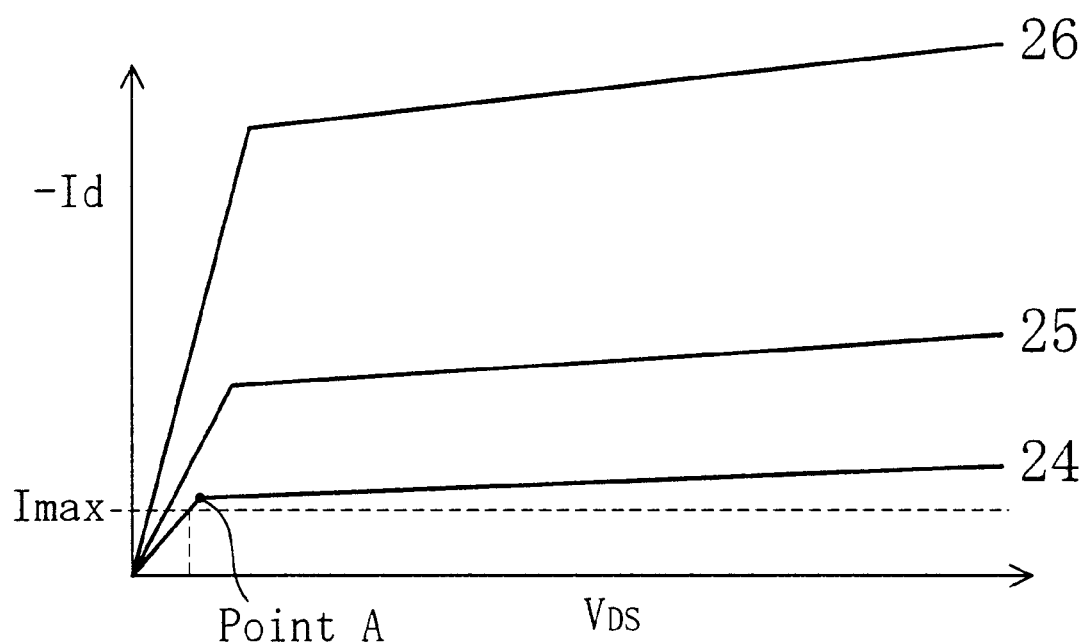
FIG. 6 is a diagram for showing the characteristics of transistors belonging to respective groups 24 through 26.

The number of transistors belonging to each group is determined as follows: FIG. 6 is a diagram for showing the characteristics of the transistors belonging to the groups 24 through 26. Also in FIG. 6, it is assumed for the sake of understanding that the gate potentials of the respective output switching transistors are set to fall at the same time.

First, the number of transistors belonging to the first group 24 is determined so that a drain current value in a non-saturation region of the drain voltage-current characteristic can be larger than the maximum load current value to be output by the switching regulator. In FIG. 6, a point A corresponds to a boundary between a non-saturation region and a saturation region in the characteristic of the transistor belonging to the first group 24, and a current value at the point A is larger than the maximum load current value Imax of the switching regulator.

Next, with respect to transistors belonging to the second group 25, a switching interval is set so that they can be turned on when the characteristic of the transistor belonging to the first group 24 reaches the non-saturation region from the saturation region. Then, the number of transistors belonging to the second group 25 is determined as a maximum number so that a time change ratio di/dt of the total drain current can be constant at the drain-source voltage VDS attained when the characteristic of the transistor belonging to the first group 24 reaches the non-saturation region from the saturation region. Herein, the number of transistors belonging to the second group is determined as three.

Furthermore, the number of transistors belonging to the third group 26 is determined so that the time change ratio di/dt of the total drain current can be constant when they are turned on. Herein, the number of transistors belonging to the third group is determined as five.

In this manner, the number of transistors belonging to each group is determined so as to make the time change ratio di/dt of the current constant, and the transistors are turned on in the on operation so that a larger number of transistors can be successively turned on and are turned off in the off operation so that a smaller number of transistors can be successively turned off. As a result, the abrupt current change can be prevented in the switching operation of the output switching transistors, so as to reduce the noise derived from the parasitic inductor.

Although the number of transistors belonging to the first group to be turned on first is one in the above-described case, plural transistors can be turned on first.

Next, the internal configuration of the driving circuit 40 of FIG. 1 will be described.

Figure 7:
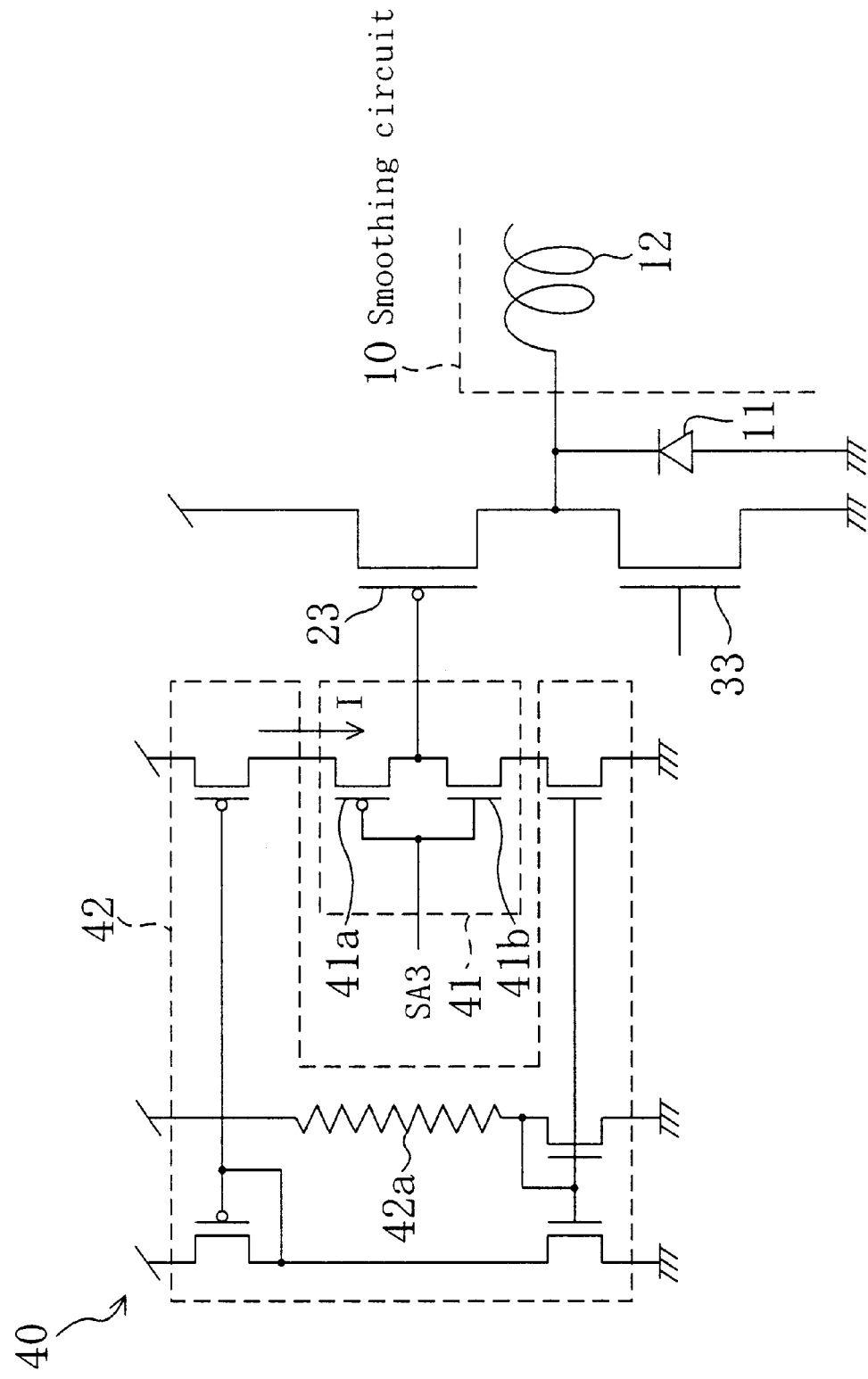
FIG. 7 is a circuit diagram for showing an internal configuration of a driving circuit 40 of FIG. 1.

FIG. 7 is a circuit diagram for showing an internal configuration of the driving circuit 40. The driving circuit 40 of FIG. 7 drives the output switching transistor 23, and includes an inverter 41 for driving the gate of the output switching transistor 23 in accordance with the signal SA3 and a constant current source circuit 42 for allowing a constant current I to flow through the inverter 41. In the description of the operation of the switching regulator described with reference to FIG. 1, the logic of a signal is assumed not to be inverted in each driving circuit 40, but the driving circuit 40 includes one inverter 41 in the description referring to FIG. 7.

If the driving circuit 40 is constructed merely from the inverter 41 including a P-type MOS transistor 41a and an N-type MOS transistor 41b, current change is so large during charge/discharge of the gate that the di/dt noise can be caused. Therefore, the driving circuit 40 includes the constant current source circuit 42 for controlling the current I flowing through the inverter 41 to be constant as is shown in FIG. 7. Thus, the abrupt current change can be prevented from being caused during the charge/discharge of the gate, resulting in preventing the occurrence of the noise.

The constant current source circuit 42 as shown in FIG. 7 is not necessarily provided in all the driving circuits 40 but can be provided in merely part of the driving circuits 40. The di/dt noise derived from the current change caused during the charge/discharge of the gate is larger in a transistor with a large transistor width. Therefore, the effect of reducing the noise can be most remarkably attained when the constant current source circuit 42 is provided in the driving circuit 40 for driving the output switching transistor 23 with the largest transistor width. It goes without saying that the effect of reducing the noise can be exhibited also when the constant current source circuit 42 is provided in the other driving circuit 40 for driving any of the output switching transistors 21 and 23 and the rectifier switching transistors 31 through 33, and that the effect of reducing the noise can be more remarkably attained in the entire switching regulator when the constant current source circuit 42 is provided in a larger number of driving circuits 40.

Figure 8:
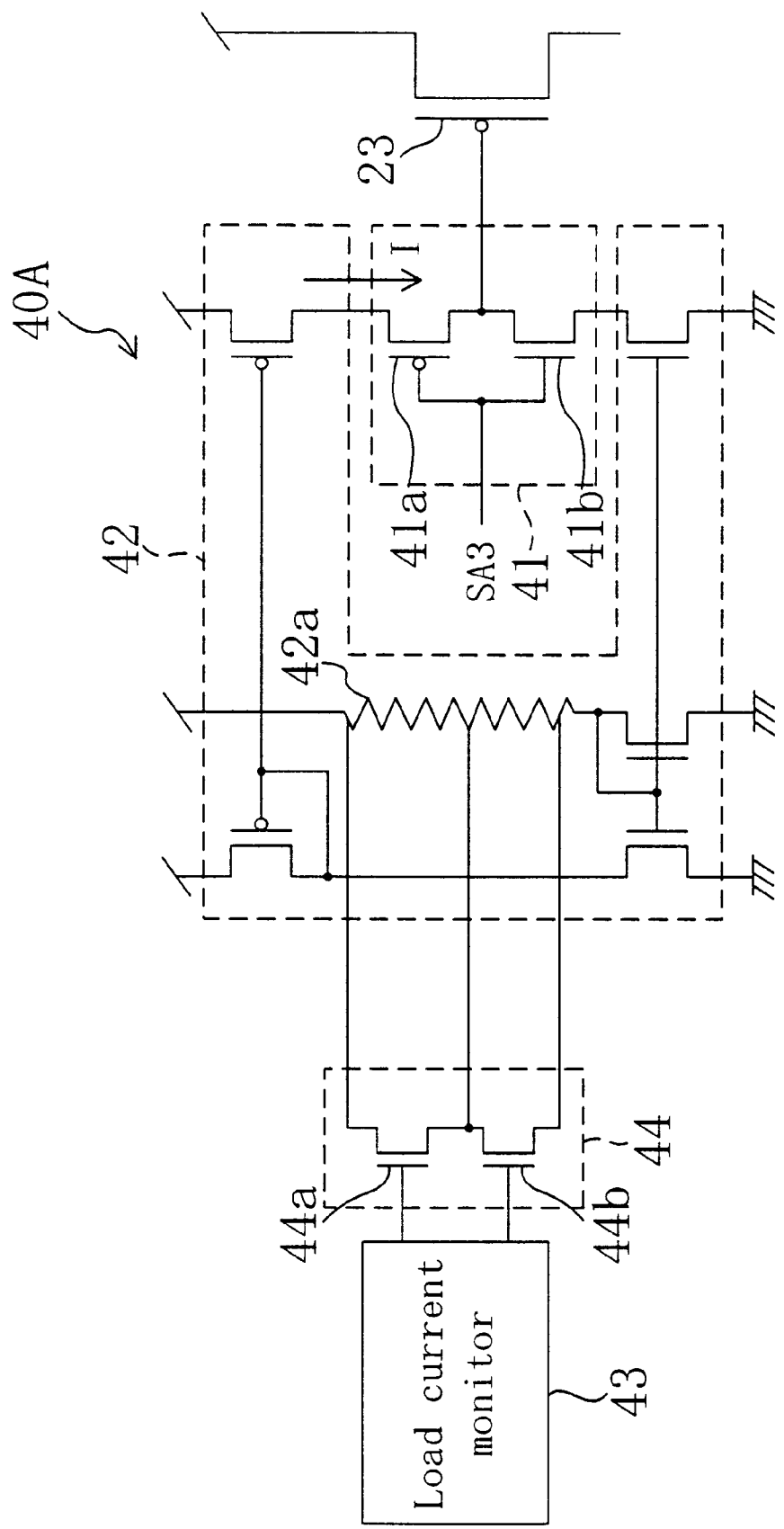
FIG. 8 is a circuit diagram for showing another internal configuration of the driving circuit 40 of FIG. 1.

FIG. 8 is a circuit diagram for showing another exemplified internal configuration of the driving circuit 40. A driving circuit 40A of FIG. 8 includes, in addition to the inverter 41 and the constant current source circuit 42, a load current monitoring circuit 43 and a current controlling circuit 44. The current controlling circuit 44 includes transistors 44a and 44b serially connected to each other and parallel connected to a resistance 42a included in the constant current source circuit 42. The load current monitoring circuit 43 controls the on/off operations of the transistors 44a and 44b of the current controlling circuit 44 in accordance with the amplitude of a load current. Thus, the resistance value of the resistance 42a is substantially controlled, so as to control the amplitude of the constant current I flowing through the inverter 41.

When the load current is small, the noise is comparatively small. Therefore, in the case where the gate charge/discharge of the output switching transistor or the rectifier switching transistor is slowed down by the constant current source circuit 42, the efficiency of the switching regulator is naturally degraded.

Accordingly, when the load current is small, the resistance 42a of the constant current source circuit 42 is partly short-circuited by the current controlling circuit 44, so as to increase the supply current I to the inverter 41. In this manner, the gate potential is abruptly changed in the gate charge/discharge of the output switching transistor 23, thereby preventing the efficiency degradation.

The load current monitoring circuit 43 can be realized in any of various configurations. For example, it can include plural comparators each for comparing the output voltage Vout with a predetermined reference voltage, so as to control the transistors 44a and 44b of the current controlling circuit 44 in accordance with the outputs of the respective comparators. Alternatively, it can monitor the drain voltage of the output switching transistor 23. Further alternatively, it can determine the amplitude of the load current in accordance with the operation state of equipment including the switching regulator. For example, in the case where the switching regulator is included in a portable telephone, it can determine that the load current is large during a call and is small in a waiting state.

Figure 9:
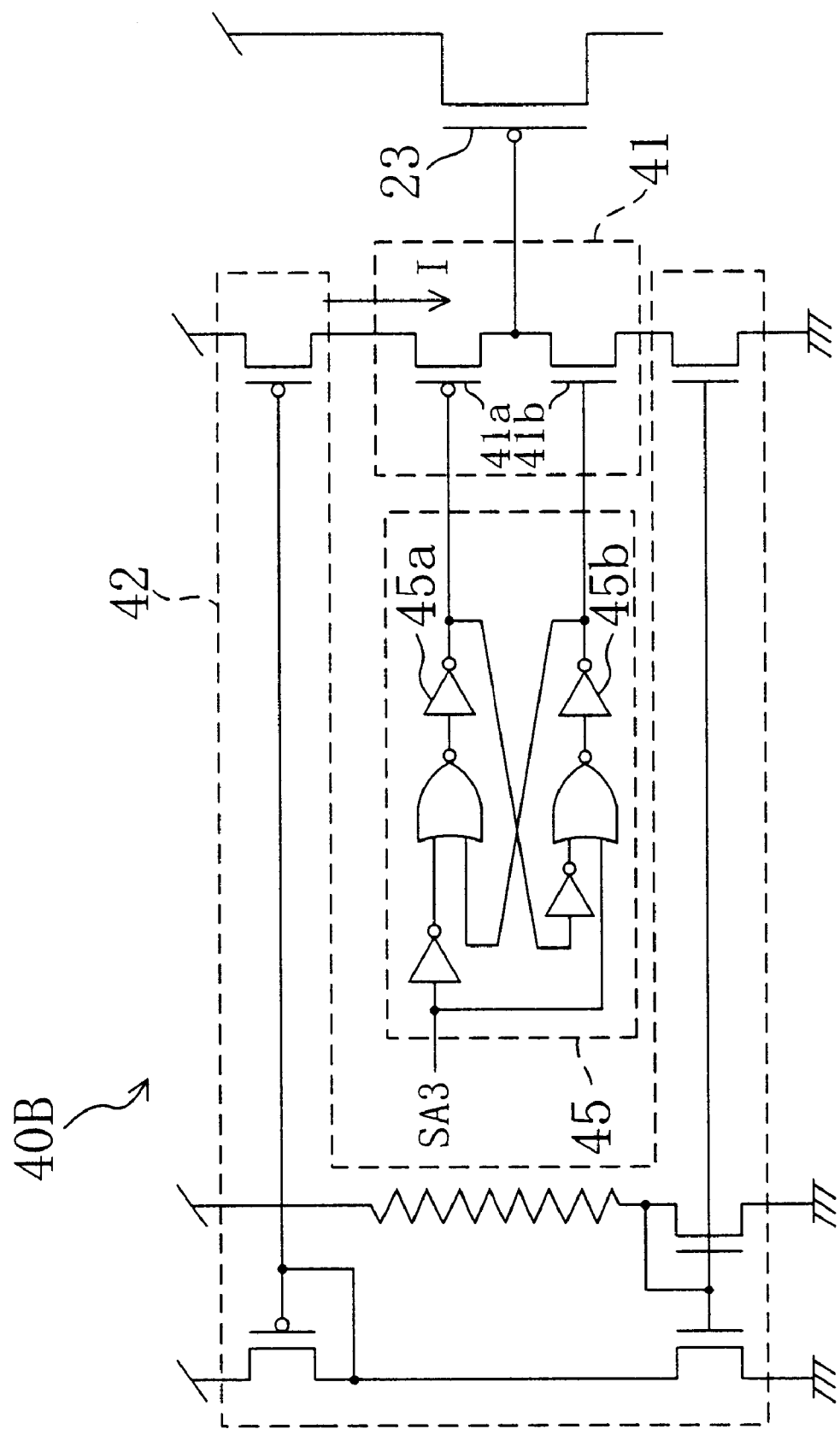
FIG. 9 is a circuit diagram for showing still another internal configuration of the driving circuit 40 of FIG. 1.

FIG. 9 is a circuit diagram for showing still another exemplified configuration of the driving circuit 40. A driving circuit 40B of FIG. 9 includes, in addition to the inverter 41 and the constant current source circuit 42, a non-overlap circuit 45.

In the configurations of FIGS. 7 and 8, the constant current source circuit 42 is provided in order to slow down the current change in the gate charge/discharge of the output switching transistor 23. When the current I flowing through the inverter 41 is made too small, however, a longer time is required for the gate charge/discharge, and hence, the efficiency is degraded although the noise can be reduced. In order to slow down the current change in the gate charge/discharge of the output switching transistor 23 as well as to suppress the efficiency degradation, the switching of the inverter 41 can be slowed down.

In this case, however, there is a fear of a time period when the P-type MOS transistor 41a and the N-type MOS transistor 41b of the inverter 41 are both in an on state, which can allow a through-current to flow through the inverter 41.

Accordingly, in the configuration of FIG. 9, the non-overlap circuit 45 is provided for gate control of the inverter elements 41a and 41b of the inverter 41, so as to prevent the inverter elements 41a and 41b from being both placed in an on state. As a result, the occurrence of the through-current in the inverter 41 can be avoided.

Furthermore, in inverters 45a and 45b of the non-overlap circuit 45, the transistor widths of transistors therein are preferably asymmetrical. Specifically, the transistor width of the transistor in the inverter 45a is set so that the output potential thereof can slowly fall and abruptly rise, thereby slowly turning on and rapidly turning off the P-type MOS transistor 41a. Similarly, the transistor width of the transistor in the inverter 45b is set so that the output potential thereof can slowly rise and abruptly fall, thereby slowly turning on and rapidly turning off the N-type MOS transistor 41b.

Figure 10:
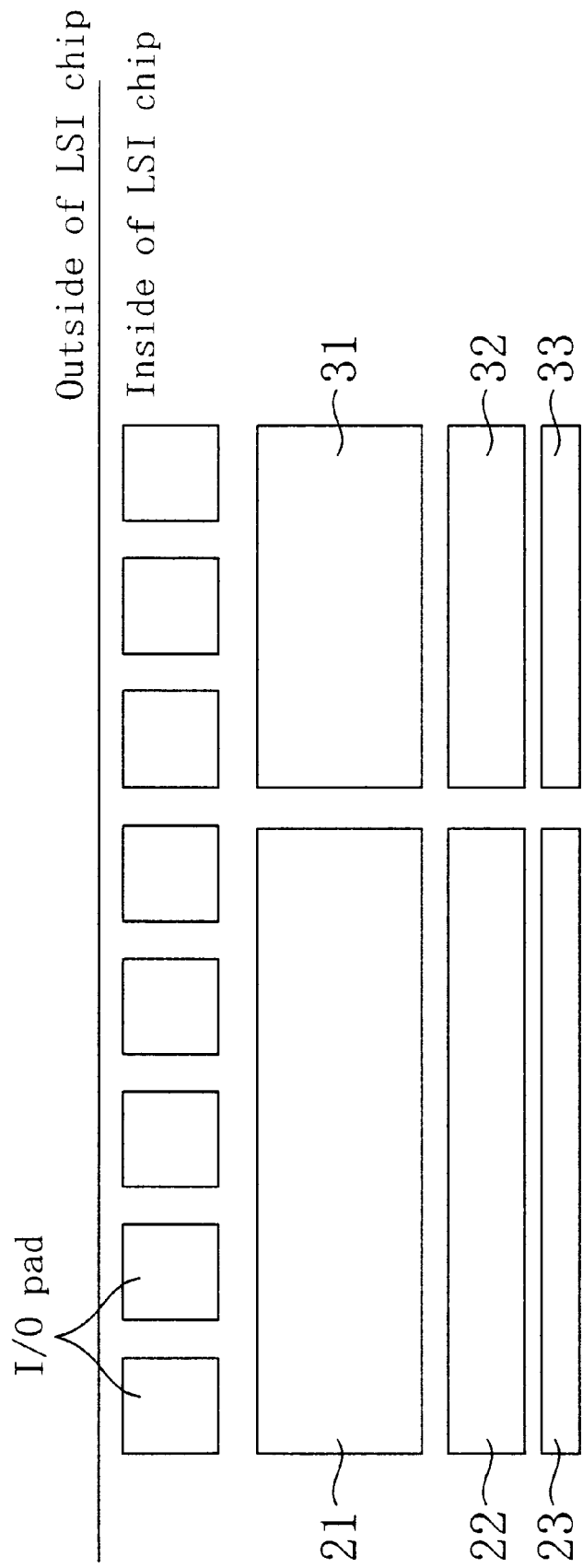
FIG. 10 is a diagram for showing an exemplified layout of the output switching transistors 21 through 23 and rectifier switching transistors 31 through 33 of FIG. 1.

FIG. 10 is a schematic diagram for showing an exemplified layout of the output switching transistors 21 through 23 and the rectifier switching transistors 31 through 33 of FIG. 1. As is shown in FIG. 10, the transistors 21 and 31 having comparatively large sizes are disposed comparatively closer to I/O pads while the transistors 23 and 33 having comparatively small sizes are disposed comparatively farther from the I/O pads. Since the transistors 21 and 31 with large sizes are provided for attaining high conversion efficiency, they should be disposed closer to the I/O pads, so as to reduce line resistances by decreasing the lengths of the lines. On the other hand, since the transistors 23 and 33 with small sizes are provided for reducing the noise by using their high on-resistances, increase of line resistances due to longer lines by placing them farther from the I/O pads is rather preferred.

Also, each of the transistors 21 and 31 also works as a diode for releasing charge of a surge, and hence, it is preferred, in consideration of protection from the surge, that the transistors 21 and 31 with large sizes are disposed closer to the peripheral portion of an LSI chip.

Embodiment 2

Figure 11:
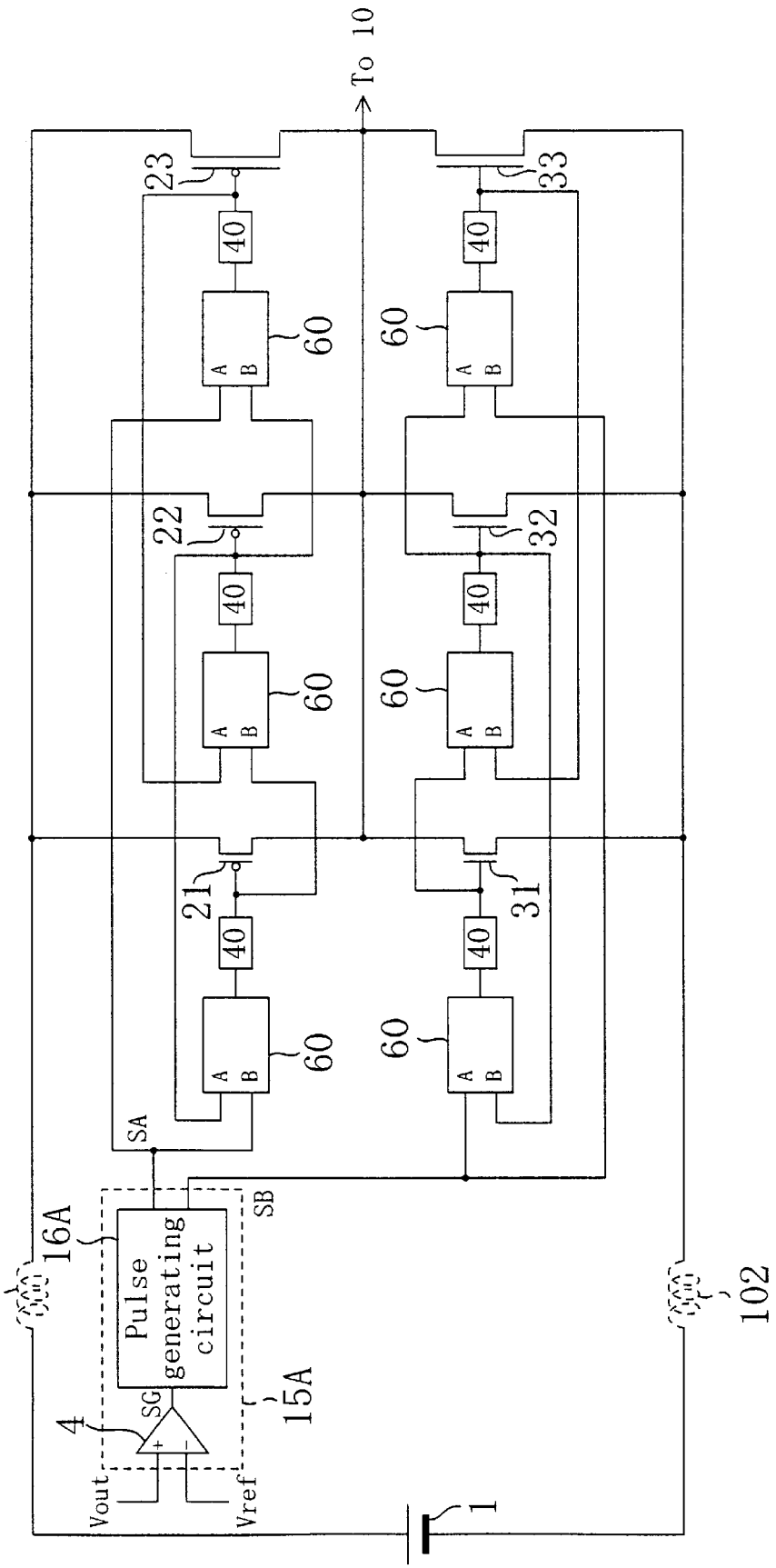
FIG. 11 is a diagram for showing the configuration of a switching regulator according to Embodiment 2 of the invention.

FIG. 11 is a diagram for showing the configuration of a switching regulator of Embodiment 2 of the invention. In FIG. 11, like reference numerals are used to refer to like elements used in FIG. 1. in the configuration of FIG. 11, a pulse generating circuit 16A of a controller 15A outputs, in response to an output signal SG of a voltage comparator 4, two signals SA and SB for controlling the on/off operations of switching transistors 21 through 23 and 31 through 33. Furthermore, each of the switching transistors 21 through 23 and 31 through 33 is provided with an edge detecting circuit 60 disposed at a previous stage of a driving circuit 40. Each edge detecting circuit 60 receives, at its inputs A and B, the output signal of the pulse generating circuit 16A or a gate signal output from the driving circuit 40 correspondingly provided to another switching transistor.

Figure 12A:
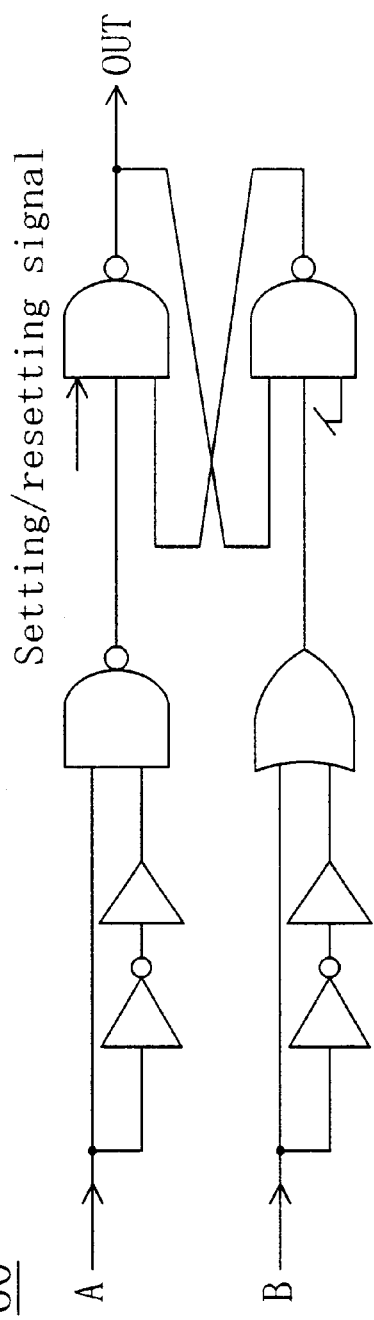
FIG. 12(a) is a diagram for showing the internal configuration of an edge detecting circuit 60 of FIG. 11
Figure 12B:
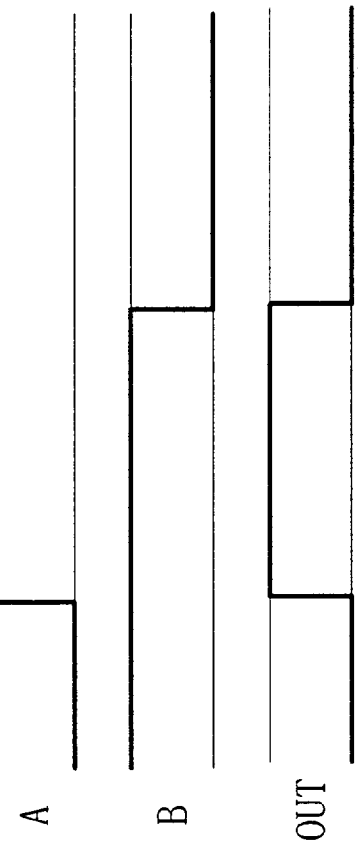
FIG. 12(b) is a timing chart of input/output of the edge detecting circuit 60 of FIG. 12(a)

FIG. 12(a) is a diagram for showing the internal configuration of the edge detecting circuit 60, and FIG. 12(b) is a timing chart of the inputs A and B and the output OUT of the edge detecting circuit 60 of FIG. 12(a). As is shown in FIG. 12(b), the output OUT of the edge detecting circuit 60 becomes high at the rise edge of the input A and becomes low at the fall edge of the input B.

Now, the operation of the switching regulator of FIG. 11 will be described.

The output switching transistors 21 through 23 are operated as follows: In the on operation of the output switching transistors 21 through 23, the signal SA of the pulse generating circuit 16A undergoes a low transition. In response to this fall of the signal SA, the output switching transistor 21 having the largest on-resistance is first turned on. Next, in response to the fall of the gate signal of the output switching transistor 21, the output switching transistor 22 at the next stage is turned on. Similarly, in response to the fall of the gate signal of the output switching transistor 22, the output switching transistor 23 having the smallest on-resistance is turned on. Specifically, the output switching transistors 21 through 23 are successively turned on in the descending order of on-resistance in response to the fall of the output signal SA of the pulse generating circuit 16A.

On the other hand, in the off operation of the output switching transistors 21 through 23, the signal SA of the pulse generating circuit 16A undergoes a high transition. In response to this rise of the signal SA, the output switching transistor 23 having the smallest on-resistance is turned off first. Next, in response to the rise of the gate signal of the output switching transistor 23, the output switching transistor 22 is turned off, and similarly, in response to the rise of the gate signal of the output switching transistor 22, the output switching transistor 21 is turned off. Specifically, the output switching transistors 21 through 23 are successively turned off in the ascending order of on-resistance in response to the rise of the output signal SA of the pulse generating circuit 16A.

The rectifier switching transistors 31 through 33 are similarly operated. In the on operation of the rectifier switching transistors 31 through 33, the signal SB of the pulse generating circuit 16A under goes a high transition. In response to this rise of the signal SB, the rectifier switching transistor 31 having the largest on-resistance is turned on. In response to the rise of the gate signal of the rectifier switching transistor 31, the rectifier switching transistor 32 is turned on, and in response to the rise of the gate signal of the rectifier switching transistor 32, the rectifier switching transistor 33 having the smallest on-resistance is turned on. On the other hand, in the off operation of the rectifier switching transistors 31 through 33, the signal SB of the pulse generating circuit 16A undergoes a low transition. In response to this fall of the signal SB, the rectifier switching transistor 33 having the smallest on-resistance is turned off, and thereafter, the rectifier switching transistors 32 and 31 are successively turned off. Specifically, the rectifier switching transistors 31 through 33 are successively turned on in the descending order of on-resistance in response to the rise of the output signal SB of the pulse generating circuit 16A, and are successively turned off in the ascending order of on-resistance in response to the fall of the signal SB.

In this manner, the on/off operations of the output and rectifier switching transistors are controlled in accordance with the two pulse signals SA and SB output from the pulse generating circuit 16A in this embodiment. Accordingly, even when the number of stages of the switching transistors is increased, there is no need to increase the numbers of gate control signals and signal lines.

Embodiment 3

Figure 13:
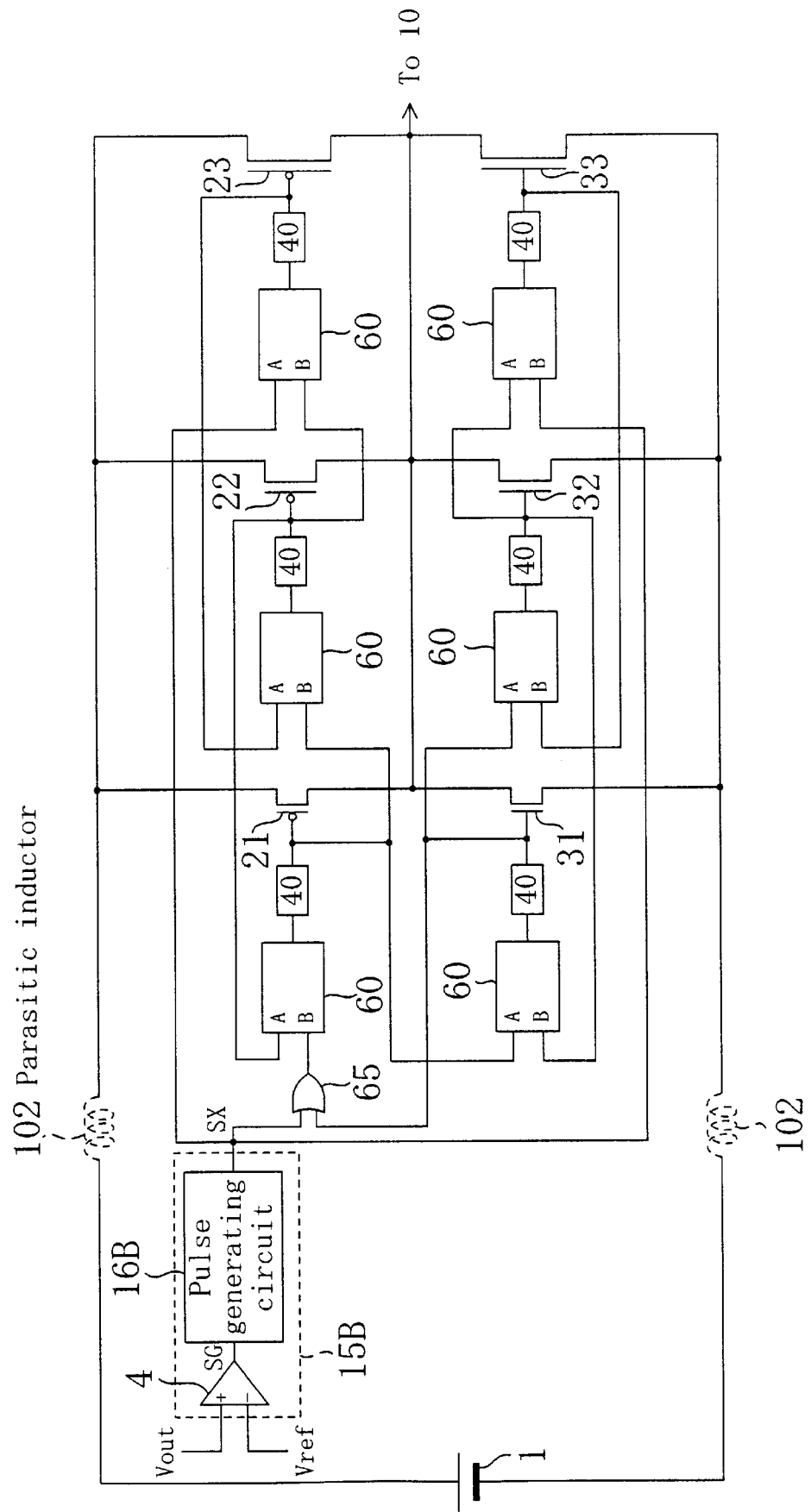
FIG. 13 is a diagram for showing the configuration of a switching regulator according to Embodiment 3 of the invention.

FIG. 13 is a diagram for showing the configuration of a switching regulator of Embodiment 3 of the invention. In FIG. 13, like reference numerals are used to refer to like elements used in FIG. 11.

In the configuration of FIG. 13, a pulse generating circuit 16B included in a controller 15B outputs one signal SX, which is supplied to an input A of an edge detecting circuit 60 corresponding to an output switching transistor 23 having the smallest on-resistance, to an input B of an edge detecting circuit 60 corresponding to a rectifier switching transistor 33 having the smallest on-resistance and to one input of an OR gate 65. To the other input of the OR gate 65, a gate signal of a rectifier switching transistor 31 having the largest on-resistance is supplied. The output of the OR gate 65 is supplied to an input B of an edge detecting circuit 60 corresponding to an output switching transistor 21 having the largest on-resistance. Also, to an input A of an edge detecting circuit 60 corresponding to the rectifier switching transistor 31 having the largest on-resistance, a gate signal of outputs witching transistor 21 is supplied. The configuration of FIG. 13 is the same as that of FIG. 11 except for the above.

In the on operation of the output switching transistors 21 through 23 and the off operation of the rectifier switching transistor 31 through 33, the signal SX of the pulse generating circuit 16B undergoes a low transition. As a result, the rectifier switching transistor 33 is first turned off, and the rectifier switching transistors 32 and 31 are successively turned off. Then, the output of the OR gate 65 falls in response to a fall of the gate signal of the rectifier switching transistor 31, so as to turn on the output switching transistor 21. Thereafter, the output switching transistors 22 and 23 are successively turned on.

On the other hand, in the off operation of the output switching transistors 21 through 23 and the on operation of the rectifier switching transistors 31 through 33, the signal SX of the pulse generating circuit 16B undergoes a high transition. As a result, the output switching transistor 23 is turned off, and then, the output switching transistors 22 and 21 are successively turned off. Then, the rectifier switching transistor 31 is turned on in response to a rise of the gate signal of the output switching transistor 21. Thereafter, the rectifier switching transistors 32 and 33 are successively turned on.

In this manner, the on operation and the off operation of the output switching transistors 21 through 23 are respectively carried out continuously to the off operation and the on operation of the rectifier switching transistors 31 through 33 in this embodiment. Also, the on/off operations of the output and rectifier switching transistors can be controlled in accordance with one pulse signal SX output from the pulse generating circuit 16B. Accordingly, even when the number of stages of the switching transistors is increased, there is no need to increase the numbers of gate control signals and signal lines.

Embodiment 4

Figure 14:
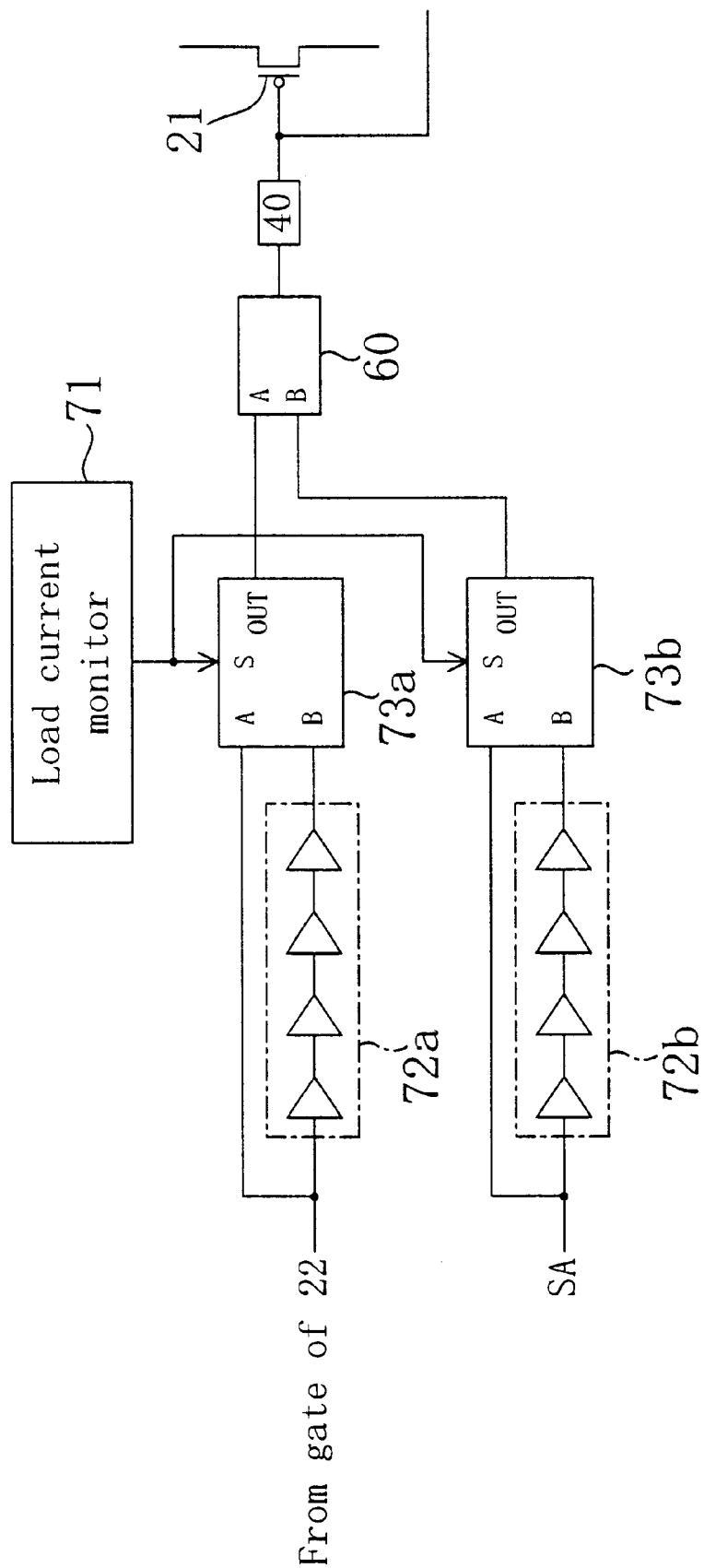
FIG. 14 is a diagram for showing part of the configuration of a switching regulator according to Embodiment 4 of the invention.

FIG. 14 is a diagram for showing part of the configuration of a switching regulator of Embodiment 4 of the invention. FIG. 14 shows the configuration related to an output switching transistor 21 alone, in which a reference numeral 71 denotes a load current monitoring circuit, reference numerals 72a and 72b denote delay circuits each including an inverter chain, and reference numerals 73a and 73b denote selection circuits each for outputting an input A as an output OUT when a selection input S is at a low level and outputting an input B as the output OUT when the selection input S is at a high level. The delay circuits 72a and 72b and the selection circuits 73a and 73b together form a timing setting circuit.

The load current monitoring circuit 71 monitors a load current quantity of the switching regulator, so as to output a signal at a low level when the load current quantity is small and a signal at a high level when the load current quantity is large. As a result, a delay between change of the gate signal of an output switching transistor 22 or change of the signal SA and change of the gate signal of the output switching transistor 21 is small when the load current is small, and is larger correspondingly to a delay obtained by the delay circuits 72a and 72b when the load current is large. Accordingly, when the load current is small, a sequential switching interval can be reduced, so that the degradation of the efficiency can be more effectively suppressed when the load current is small.

Figure 15:
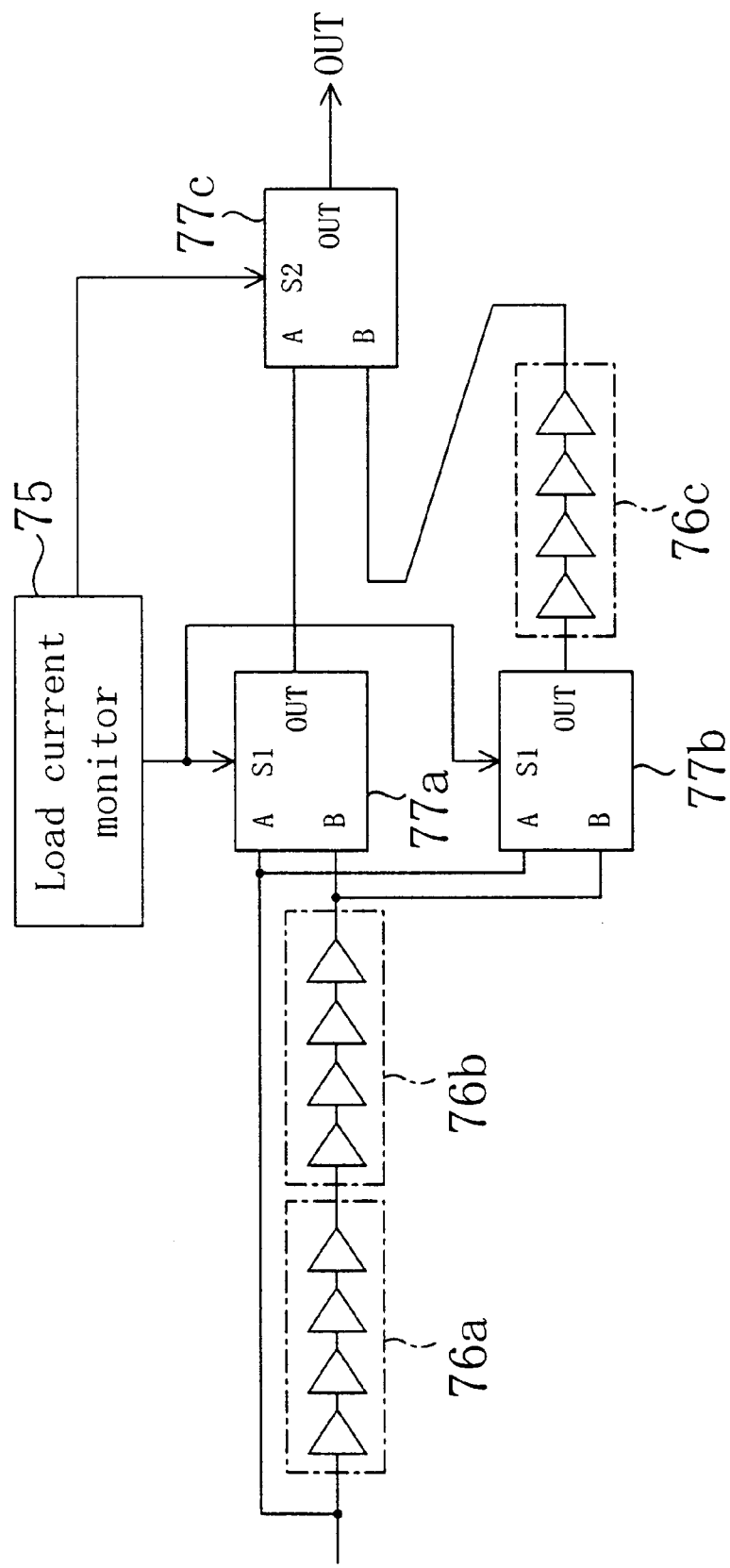
FIG. 15 is a diagram for showing modification of part of the configuration of FIG. 14.

The configuration of FIG. 14 can be provided also to the other output switching transistors or rectifier switching transistors. Furthermore, two kinds of delays can be set in accordance with the amplitude of the load current in the configuration of FIG. 14, but the configuration can be modified so that more than two kinds of delays can be set. FIG. 15 shows an exemplified circuit having a configuration in which four kinds of delays can be set.

In this manner, each sequential switching interval can be appropriately set in this embodiment, and hence, the degradation of the efficiency can be suppressed when the load current is small.

Embodiment 5

Figure 16:
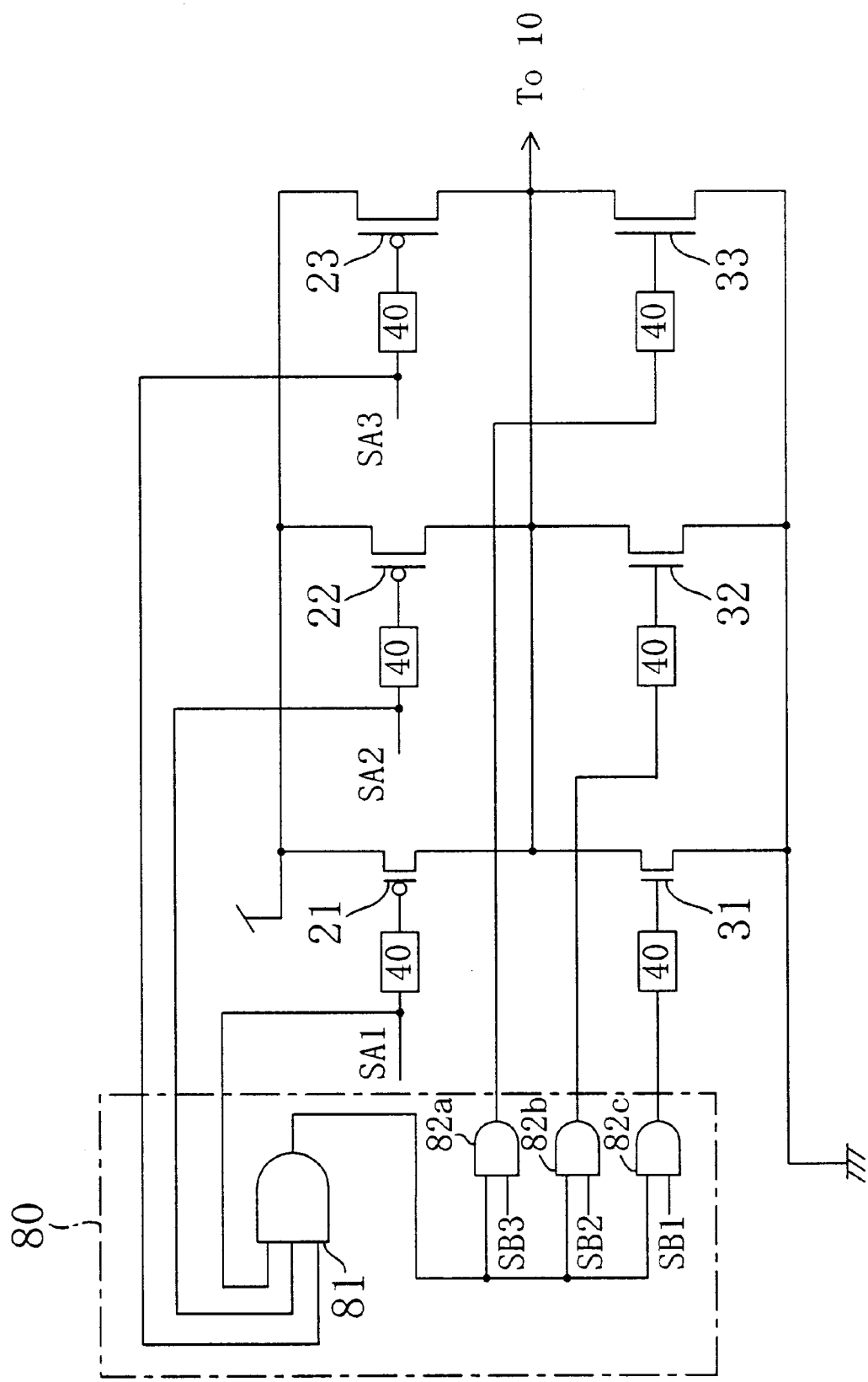
FIG. 16 is a diagram for showing the configuration of a switching regulator according to Embodiment 5 of the invention.

FIG. 16 is a circuit diagram for showing the configuration of a switching regulator of Embodiment 5 of the invention. In any of the aforementioned embodiments, when an output switching transistor and a rectifier switching transistor are both in an on state, a through-current flows therethrough. In the configuration of FIG. 16, a logic circuit 80 is provided for avoiding the occurrence of the through-current.

In the logic circuit 80 of FIG. 16, a 3-input AND circuit 81 receives, as its inputs, driving signals SA1 through SA3 for respectively driving output switching transistors 21 through 23. A 2-input AND circuits 82a through 82c receive, as one of their inputs, driving signals SB1 through SB3 for respectively driving rectifier switching transistors 31 through 33, and also receive, as the other inputs, the output of the 3-input AND circuit 81.

Owing to this configuration, when any of the plural output switching transistors 21 through 23 is in an on state, the output of the 3-input AND circuit 81 is at a low level. Therefore, the plural rectifier switching transistors 31 through 33 are all placed in an off state regardless of the logic levels of the control signals SB1 through SB3. Accordingly, the occurrence of the through-current can be avoided.

In this embodiment, since the number of output switching transistors is three, the 3-input AND circuit is used. Needless to say, the number of inputs of the AND circuit can be changed in accordance with the number of output switching transistors. Also, the logic circuit can be in any configuration as far as it can control the switching transistors so that when any of the plural output switching transistors is in an on state, the plural rectifier switching transistors are all placed in an off sate.

Now, fabrication of a switching regulator as an LSI will be complementarily described. As described above, in order to realize a switching regulator with high conversion efficiency, it is significant to reduce the on-resistances of switching transistors as much as possible. Also, the loss due to resistance components of lines and bonding wires cannot be ignored when a load current is large. Furthermore, when the switching regulator is used in portable equipment, outside components should be as few as possible and as small as possible so that the portable equipment can be in smaller shape and weight.

In consideration of the aforementioned points, a switching transistor is preferably fabricated as an on-chip with its on-resistance reduced as far as possible. Alternatively, a switching transistor with a small on-resistance alone can be fabricated outside with other transistors constructed as a non-chip. Thus, the switching noise can be reduced with keeping high conversion efficiency and with reducing the number of outside components.

Figure 17:
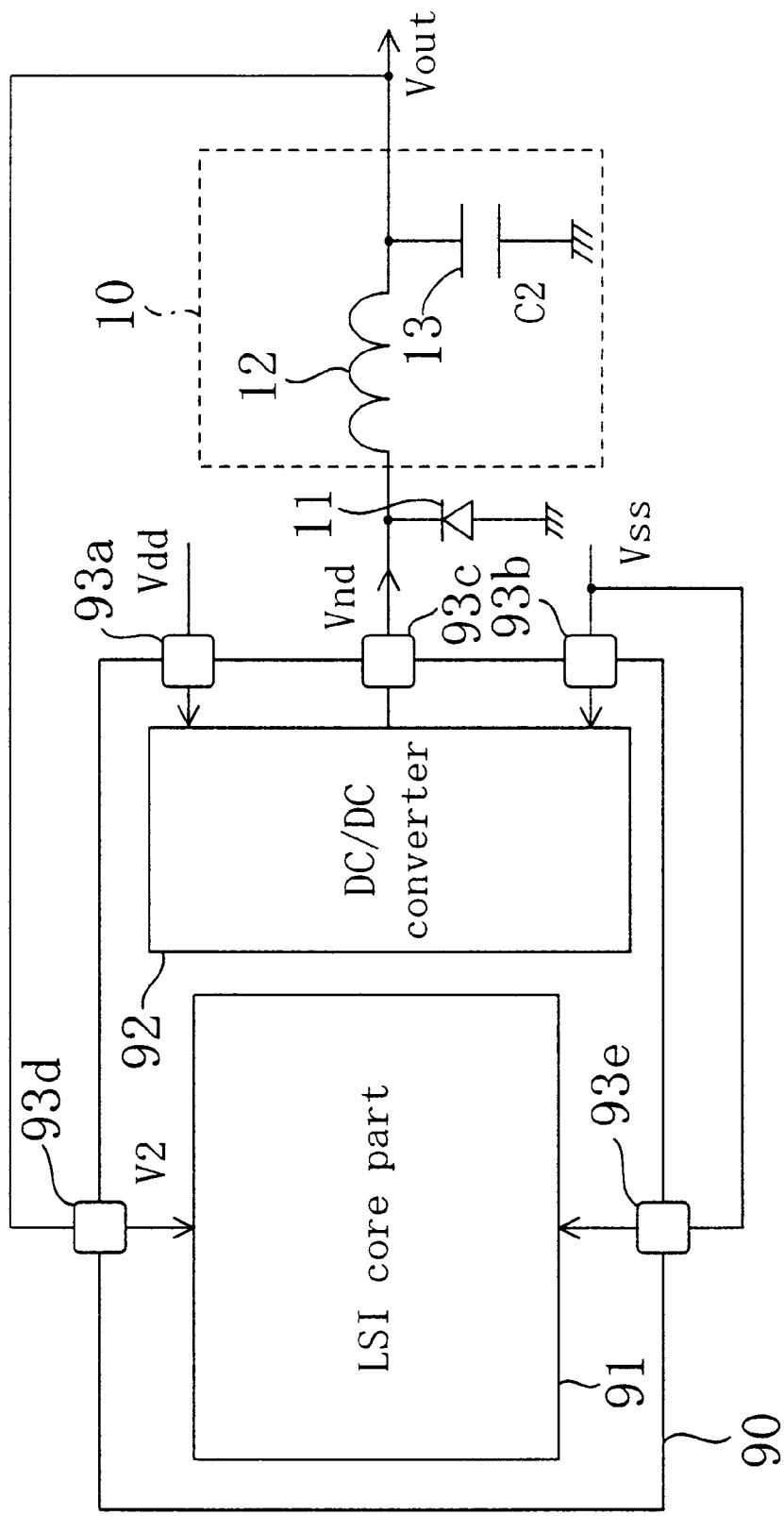
FIG. 17 is a diagram for showing the configuration of an LSI system equipped with a switching regulator of this invention.
Figure 18:
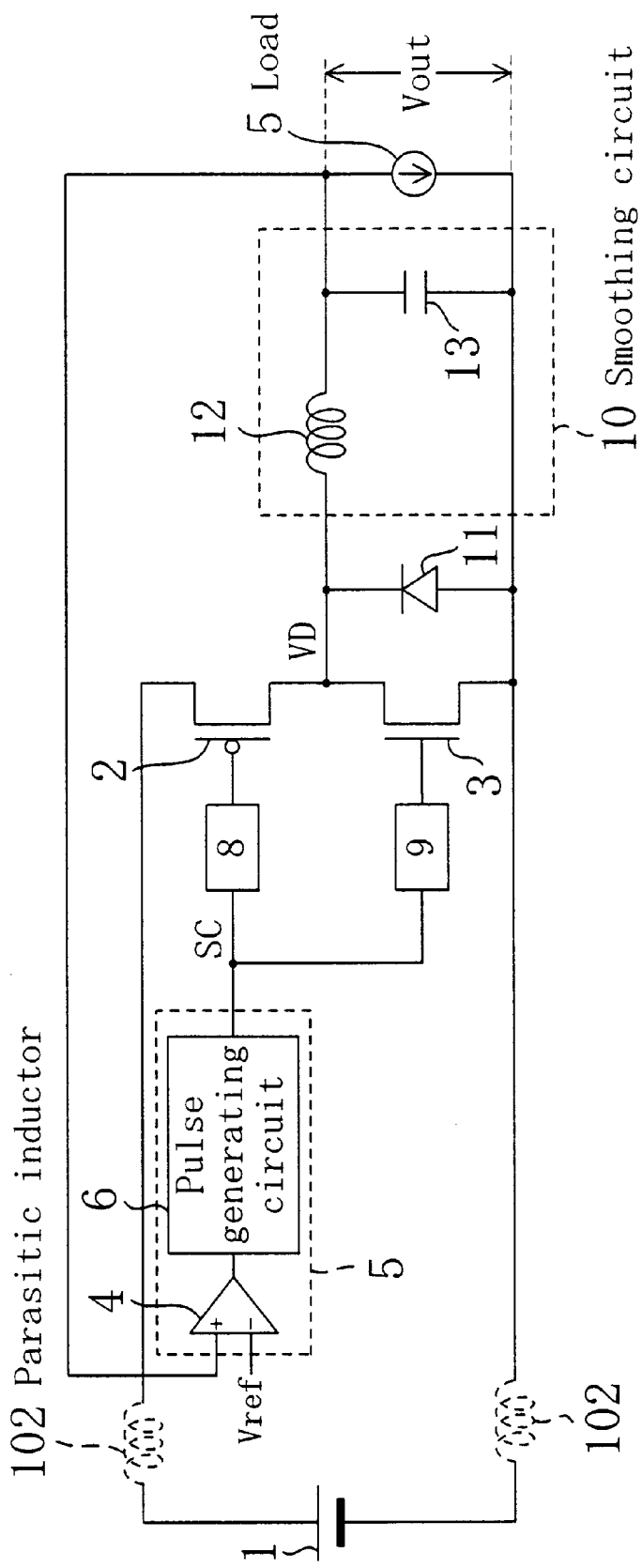
FIG. 18 is a diagram for showing the configuration of a conventional switching regulator.
Figure 19:
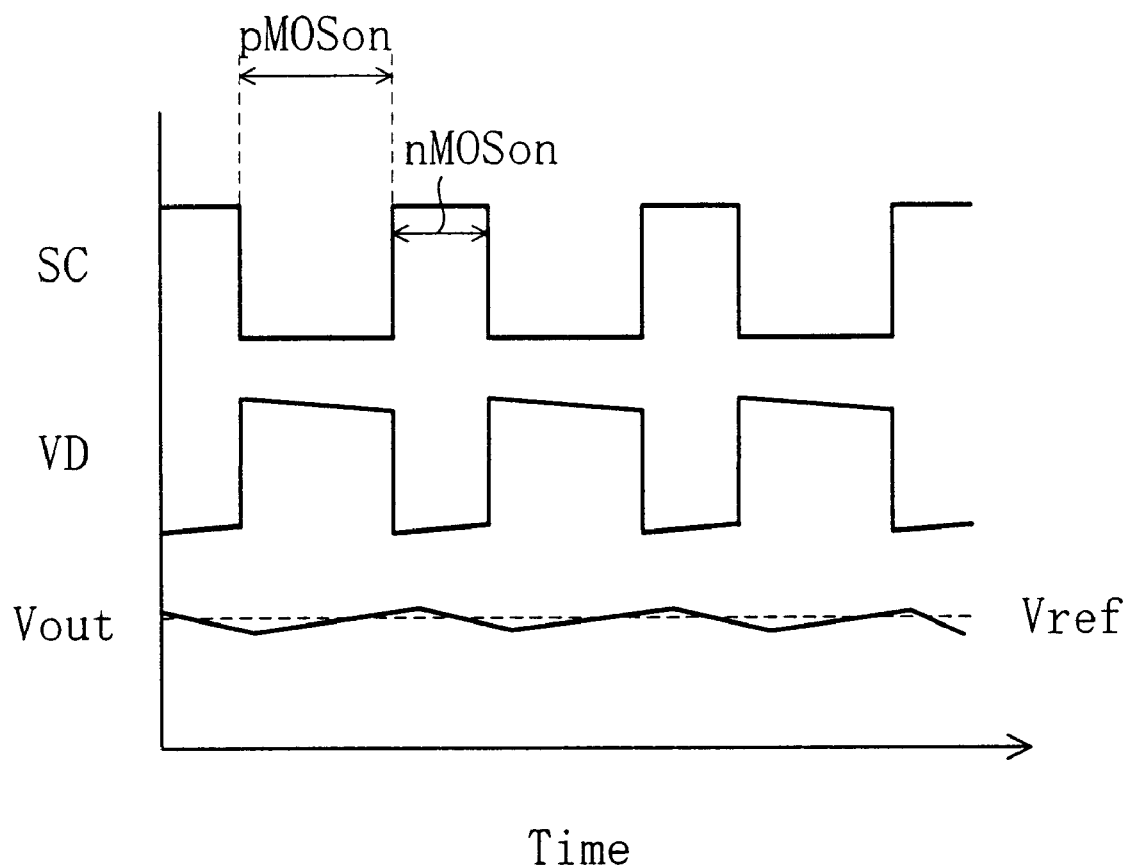
FIG. 19 is a voltage waveform diagram of the conventional switching regulator.

FIG. 17 is a diagram for showing an example of an LSI system constructed by using the switching regulator of this invention. In FIG. 17, an LSI 90 includes an LSI core part 91 and a DC/DC converter 92, and is provided with a smoothing circuit 10 as an outside component. Reference numerals 93a through 93e denote pads of the LSI 90. The DC/DC converter 92 includes, for example, plural output switching transistors as described in any of the aforementioned embodiments, and the DC/DC converter 92 and the smoothing circuit 10 together form uhe switching regulator of this invention. The DC/DC converter 92 converts power-supply potentials Vdd and Vss supplied at the pads 93a and 93b into a voltage Vnd through the operation described in any of the aforementioned embodiments, and outputs the voltage to the pad 93c. The smoothing circuit 10 smoothes the output voltage Vnd of the DC/DC converter 92 so as to output the smoothed voltage as a voltage Vout. The output voltage Vout of the smoothing circuit 10 is supplied as an internal power-supply voltage to the LSI core part 91.

What is claimed is:

1. A switching regulator comprising:
   plural output switching transistors connected in parallel to an input voltage terminal, and
   a smoothing circuit including an inductance device and capacitor, for smoothing a rectangular waveform voltage generated by on and off operations of said plural output switching transistors,
   wherein said plural output switching transistors have different on-resistances with each other,
   wherein the source terminals of said plural output switching transistors are connected in common to said input voltage terminal and the drain terminals of said plural output switching transistors are connected in common to said smoothing circuit, and
   wherein said plural output switching transistors are operated in a predetermined order in at least one of the on operation and the off operation thereof.

2. The switching regulator of claim 1,
   wherein said plural output switching transistors are turned on in a descending order of on-resistance in the on operation thereof, and said plural output switching transistors are turned off in an ascending order of on-resistance in the off operation thereof.

3. The switching regulator of claim 1,
   wherein said plural output switching transistors are turned on in an ascending order of transistor width in the on operation thereof, and said plural output switching transistors are turned off in a descending order of transistor width in the off operation thereof.

4. The switching regulator of claim 1,
   wherein one of said plural output switching transistors that is turned on first has a drain current value in a non-saturation region larger than a maximum load current value of said switching regulator.

5. The switching regulator of claim 1,
   wherein said plural output switching transistors are divided into plural groups, and
   in the on operation thereof, said plural output switching transistors are turned on by group in an ascending order of the number of output switching transistors belonging to each group, and in the off operation thereof, said plural output switching transistors are turned off by group in a descending order of the number of output switching transistors belonging to each group.

6. The switching regulator of claim 1, further comprising plural driving circuits provided correspondingly to said plural output switching transistors each for operating a corresponding one of said output switching transistors in accordance with a driving signal thereof,
   wherein at least one of said plural driving circuits includes:
      an inverter for driving a gate of the corresponding one of said output switching transistors in accordance with said driving signal; and
      a constant current source circuit for controlling a current flowing through said inverter to be constant.

7. The switching regulator of claim 6,
   wherein said at least one of said plural driving circuits includes a current controlling circuit for controlling, in accordance with a load current quantity of said switching regulator, an amplitude of the current flowing through said inverter controlled by said constant current source circuit.

8. The switching regulator of claim 6,
   wherein said at least one of said plural driving circuits includes a non-overlap circuit that receives said driving signal and supplies a signal to said inverter for preventing a P-type MOS transistor and an N-type MOS transistor included in said inverter from being in an on state at the same time.

9. The switching regulator of claim 1,
   wherein one of said plural output switching transistors having a comparatively large size is placed comparatively closer to I/O pads of an LSI including said switching regulator and another of said plural output switching transistors having a comparatively small size is placed comparatively farther from the I/O pads of said LSI.

10. The switching regulator of claim 1, further comprising a timing setting circuit provided correspondingly to at least one of said plural output switching transistors, said timing setting circuit setting timing of the corresponding one of said output switching transistors to be turned on or off in accordance with a load current value of said switching regulator.

11. The switching regulator of claim 1, further comprising plural rectifier switching transistors operated in a predetermined order in at least one of an on operation and an off operation thereof.

12. The switching regulator of claim 11,
   wherein said plural rectifier switching transistors are turned on in a descending order of on-resistance in the on operation thereof, and said plural rectifier switching transistors are turned off in an ascending order of on-resistance in the off operation thereof.

13. The switching regulator of claim 11, further comprising plural driving circuits provided correspondingly to said plural rectifier switching transistor search for operating a corresponding one of said plural rectifier switching transistors in accordance with a driving signal thereof,
   wherein at least one of said plural driving circuits includes:
      an inverter for driving a gate of the corresponding one of said rectifier switching transistors in accordance with said driving signal; and
      a constant current source circuit for controlling a current flowing through said inverter to be constant.

14. The switching regulator of claim 11, further comprising a timing setting circuit provided correspondingly to at least one of said plural rectifier switching transistors for setting timing of the corresponding one of said output switching transistors to be turned on or off in accordance with a load current value of said switching regulator.

15. The switching regulator of claim 11, further comprising a logic circuit for preventing said plural rectifier switching transistors from turning on when at least one of said plural output switching transistors is in an on state.

16. The switching regulator of claim 1, further comprising a controller for controlling the on operation and the off operation of said plural output switching transistors, wherein, in the on operation of said plural output switching transistors, said controller turns on one of said output switching transistors that is to be turned on first, and the rest of said output switching transistors are successively turned on in accordance with change of a gate signal of any of said output switching transistors that is turned on immediately before, and in the off operation of said plural output switching transistors, said controller turns off one of said outputs witching transistors that is to be turned off first, and the rest of said output switching transistors are successively turned off in accordance with change of a gate signal of any of said output switching transistors that is turned off immediately before.

17. The switching regulator of claim 16, further comprising plural rectifier switching transistors operated in a predetermined order in an on operation and an off operation thereof, wherein, in the on operation of said plural output switching transistors, said controller turns off one of said rectifier switching transistors that is to be turned off first, and the rest of said rectifier switching transistors are successively turned off in accordance with change of a gate signal of any of said rectifier switching transistors that is turned off immediately before, and one of said output switching transistors that is to be turned on first is turned on in accordance with change of a gate signal of any of said rectifier switching transistors that is turned off lastly, and the rest of said output switching transistors are successively turned on in accordance with change of a gate signal of any of said output switching transistors that is turned on immediately before, and in the off operation of said plural output switching transistors, said controller turns off one of said output switching transistors that is to be turned off first, and the rest of said output switching transistors are successively turned off in accordance with change of a gate signal of any of said output switching transistors that is turned off immediately before, and one of said rectifier switching transistors that is to be turned on first is turned on in accordance with change of a gate signal of any of said output switching transistors that is turned off lastly, and the rest of said rectifier switching transistors are successively turned on in accordance with change of a gate signal of any of said rectifier switching transistors that is turned on immediately before.

18. An LSI system comprising:
said switching regulator of claim 1; and
an LSI core part operated by a voltage supplied from said switching regulator.

19. A switching regulator comprising:
plural output switching transistors connected in parallel to an input voltage terminal, and
a smoothing circuit including an inductance device and capacitor, for smoothing a rectangular waveform voltage generated by on and off operations of said plura output switching transistors, wherein said plural output switching transistors have different on-resistances with each other;

wherein the source terminals of said plural output switching transistors are connected in common to said input voltage terminal and the drain terminals of said plural output switching transistors are connected in common to said smoothing circuit, and wherein said plural output switching transistors are operated in a predetermined order in at least one of the on operation and the off operation thereof, wherein said plural output switching transistors are turned on in a descending order of on-resistance in the on operation thereof, and said plurality of output switching transistors are turned of in an ascending order of on-resistance in the off operation thereof.

20. A switching regulator in accordance with claim 19, wherein one of said plural output switching transistors that is turned on first has a drain current value in a non-saturation region larger than a maximum load current value of said switching regulator.

21. A switching regulator comprising:
plural output switching transistors connected in parallel to an input voltage terminal, and
a smoothing circuit including an inductance device and capacitor, for smoothing a rectangular waveform voltage generated by on and off operations of said plural output switching transistors, wherein the source terminals of said plural output switching transistors are connected in common to said input voltage terminal and the drain terminals of said plural output switching transistors are connected in common to said smoothing circuit, and wherein said plural output switching transistors are operated in a predetermined order in an on operation, and an identical one of said plural output switching transistors is turned on first.

22. A switching regulator comprising:
plural output switching transistors connected in parallel to an input voltage terminal, and
a smoothing circuit including an inductance device and capacitor, for smoothing a rectangular waveform voltage generated by on and off operations of said plural output switching transistors.

wherein the source terminals of said plural output switching transistors are connected in common to said input voltage terminal and the drain terminals of said plural output switching transistors are connected in common to said smoothing circuit, and wherein said plural output switching transistors are operated in a predetermined order in an off operation, and an identical one of said plural output switching transistors is turned off first.

23. A switching regulator comprising:
plural output switching transistors connected in parallel to an input voltage terminal, and
a smoothing circuit including an inductance device and capacitor, for smoothing a rectangular waveform voltage generated by on and off operations of said plural output switching transistors wherein the source terminals of said plural output switching transistors are connected in common to said input voltage terminal and the drain terminals of said plural output switching transistors are connected in common to said smoothing circuit, wherein said plural output switching transistors are operated in a predetermined order in an on operation and an off operation thereof, wherein said plural output switching transistors are divided into plural groups, and in the on operation thereof, said plural output switching transistors are turned on by group in an ascending order of the number of output switching transistors belonging to each group, and in the off operation thereof, said plural output switching transistors are turned off by group in a descending order of the number of output switching transistors belonging to each group.

* * * * *

UNITED STATES PATENT AND TRADEMARK OFFICE
CERTIFICATE OF CORRECTION

PATENT NO.   : 6,429,633 B1
DATED        : August 6, 2002
INVENTOR(S)  : Jun Kajiwara et al.

It is certified that error appears in the above-identified patent and that said Letters Patent is hereby corrected as shown below:

Title page,
Item [56], References Cited, U.S. PATENT DOCUMENTS, add
-- 5,399,908 A * 3/1995 Donaldson..................307/58 --
Item [74], *Attorney, Agent, or Firm*, delete "Donald R. Seudebaker" add
-- Donald R. Studebaker --.

Column 15,
Lines 55-64, delete claim 5, and renumber claims 6-23 as 5-22 as shown:

[6.] 5. The switching regulator of claim 1, further comprising plural driving circuits provided correspondingly to said plural output switching transistors each for operating a corresponding one of said output switching transistors in accordance with a driving signal thereof, wherein at least one of said plural driving circuits includes:

an inverter for driving a gate of the corresponding one of said output switching transistors in accordance with said driving signal; and a constant current source for controlling a current flowing through said inverter to be constant.

[7.] 6. The switching regulator of claim [6,] 5, wherein said at least one of said plural driving circuits includes a current controlling circuit for controlling, in accordance with a load current quantity of said switching regulator, an amplitude of the current flowing through said inverter controlled by said constant current source circuit.

UNITED STATES PATENT AND TRADEMARK OFFICE
CERTIFICATE OF CORRECTION

PATENT NO.    : 6,429,633 B1
DATED         : August 6, 2002
INVENTOR(S)   : Jun Kajiwara et al.

It is certified that error appears in the above-identified patent and that said Letters Patent is hereby corrected as shown below:

[8.] 7. The switching regulator of claim [6,] 5,
wherein said at least one of said plural driving circuits includes a non-overlap circuit that receives said driving signal and supplies a signal to said inverter for preventing a P-type MOS transistor and an N-type MOS transistor included in said inventor from being in an on state at the same time.

[9.] 8. The switching regulator of claim 1,
wherein one of said plural output switching transistors having a comparatively large size is placed comparatively closer to I/O pads of an LSI including said switching regulator and another of said plural output switching transistors having a comparatively small size is placed comparatively farther from the I/O pads of said LSI.

[10.] 9. The switching regulator of claim 1, further comprising a timing setting circuit provided correspondingly to at least one of said plural output switching transistors, said timing setting circuit setting timing of the corresponding one of said output switching transistors to be turned on or off in accordance with a load current value of said switching regulator.

[11.] 10. The switching regulator of claim 1, further comprising plural rectifier switching transistors operated in a predetermined order in at least one of an on operation and an off operation thereof.

[12.] 11. The switching regulator of claim [11,] 10,
wherein said plural rectifier switching transistors are turned on in a descending order of on-resistance in the on operation thereof, and said plural rectifier switching transistors, are turned off in an ascending order of on-resistance in the off operation thereof.

[13.] 12. The switching regulator of claim [11,] 10, further comprising plural driving circuits provided correspondingly to said plural rectifier switching transistor search for operating a corresponding one of said plural rectifier switching transistors in accordance with a driving signal thereof,
wherein at least one of said plural driving circuits includes:
an inverter for driving a gate of the corresponding one of said rectifier switching transistors in accordance with said driving signal; and
a constant current source circuit for controlling a current flowing through said inverter to be constant.

[14.] 13. The switching regulator of claim [11,] 10, further comprising a timing setting circuit provided correspondingly to at least one of said plural rectifier switching transistors for setting timing of the corresponding one of said output switching transistors to be turned on or off in accordance with a load current value of said switching regulator.

UNITED STATES PATENT AND TRADEMARK OFFICE
CERTIFICATE OF CORRECTION

PATENT NO. : 6,429,633 B1
DATED : August 6, 2002
INVENTOR(S) : Jun Kajiwara et al.

It is certified that error appears in the above-identified patent and that said Letters Patent is hereby corrected as shown below:

[15.] 14. The switching regulator of claim [11,] 10, further comprising a logic circuit for preventing said plural rectifier switching transistors from turning on when at least one of said plural output switching transistors is in an on state.

[16.] 15. The switching regulator of claim 1, further comprising a controller for controlling the on operation and the off operation of said plural output switching transistors, wherein, in the on operation of said plural output switching transistors, said controller turns on one of said output switching transistors that is to be turned on first, and the rest of said output switching transistors are successively turned on in accordance with change of a gate signal of any of said output switching transistors that is turned on immediately before, and in the off operation of said plural output switching transistors, said controller turns off one of said outputs switching transistors that is to be turned off first, and the rest of said output switching transistors are successively turned off in accordance with change of a gate signal of any of said output switching transistors that is turned off immediately before.

[17.] 16. The switching regulator of claim [16,] 15, further comprising plural rectifier switching transistors operated in a predetermined order in an on operation and an off operation thereof, wherein, in the on operation of said plural output switching transistors, said controller turns off one of said rectifier switching transistors that is to be turned off first, and the rest of said rectifier switching transistors are successively turned off in accordance with change of a gate signal of any of said rectifier switching transistors that is turned off immediately before, and one of said output switching transistors that is to be turned on first is turned on in accordance with change of a gate signal of any of said rectifier switching transistors that is turned off lastly, and the rest of said output switching transistors are successively turned on in accordance with change of a gate signal of any of said output switching transistors that is turned on immediately before, and in the off operation of said plural output switching transistors, said controller turns off one of said output switching transistors that is to be turned off first, and the rest of said output switching transistors are successively turned off in accordance with change of a gate signal of any of said output switching transistors that is turned off immediately before, and one of said rectifier switching transistors that is to be turned on first is turned on in accordance with change of a gate signal of any of said output switching transistors that is turned off lastly, and the rest of said rectifier switching transistors are successively turned on in accordance with change of a gate signal of any of said rectifier switching transistors that is turned on immediately before.

[18.] 17. An LSI system comprising:
said switching regulator of claim 1; and
an LSI core part operated by a voltage supplied from said switching regulator.

UNITED STATES PATENT AND TRADEMARK OFFICE
CERTIFICATE OF CORRECTION

PATENT NO. : 6,429,633 B1
DATED : August 6, 2002
INVENTOR(S) : Jun Kajiwara et al.

It is certified that error appears in the above-identified patent and that said Letters Patent is hereby corrected as shown below:

[19.] 18. A switching regulator comprising:
plural output switching transistors connected in parallel to an input voltage terminal, and
a smoothing circuit including an inductance device and capacitor, for smoothing a rectangular waveform voltage generated by on and off operations of said plura output switching transistors,
wherein said plural output switching transistors have different on-resistances with each other,
wherein the source terminals of said plural output switching transistors are connected in common to said input voltage terminal and the drain terminals of said plural output switching transistors are connected in common to said smoothing circuit, and
wherein said plural output switching transistors are operated in a predetermined order in at least one of the on operation and the off operation thereof,
wherein said plural output switching transistors are turned on in a descending order of on-resistance in the on operation thereof, and said plurality of output switching transistors are turned of in an ascending order of on-resistance in the off operation thereof.

[20.] 19. A switching regulator in accordance with claim [19,] 18, wherein one of said plural output switching transistors that is turned on first has a drain current value in a non-saturation region larger than a maximum load current value of said switching regulator.

[21.] 20. A switching regulator comprising:
plural output switching transistors connected in parallel to an input voltage terminal, and
a smoothing circuit including an inductance device and capacitor, for smoothing a rectangular waveform voltage generated by on and off operations of said plural output switching transistors,
wherein the source terminals of said plural output switching transistors are connected in common to said input voltage terminal and the drain terminals of said plural output switching transistors are connected in common to said smoothing circuit, and
wherein said plural output switching transistors are operated in a predetermined order in an on operation, and an identical one of said plural output switching transistors is turned on first.

[22.] 21. A switching regulator comprising:
plural output switching transistors connected in parallel to an input voltage terminal, and
a smoothing circuit including an inductance device and capacitor, for smoothing a rectangular waveform voltage generated by on and off operations of said plural output switching transistors.
wherein the source terminals of said plural output switching transistors are connected in common to said input voltage terminal and the drain terminals of said plural output switching transistors are connected in common to said smoothing circuit, and
wherein said plural output switching transistors are operated in a predetermined order in an off operation,

UNITED STATES PATENT AND TRADEMARK OFFICE
CERTIFICATE OF CORRECTION

PATENT NO. : 6,429,633 B1
DATED : August 6, 2002
INVENTOR(S) : Jun Kajiwara et al.

It is certified that error appears in the above-identified patent and that said Letters Patent is hereby corrected as shown below:

and an identical one of said plural output switching transistors is turned off first.

[23.] 22. A switching regulator comprising:
plural output switching transistors connected in parallel to an input voltage terminal, and a smoothing circuit including an inductance device and capacitor, for smoothing a rectangular waveform voltage generated by on and off operations of said plural output switching transistors wherein the source terminals of said plural output switching transistors are connected in common to said input voltage terminal and the drain terminals of said plural output switching transistors are connected in common to said smoothing circuit, wherein said plural output switching transistors are operated in a predetermined order in an on operation and an off operation thereof, wherein said plural output switching transistors are divided into plural groups, and in the on operation thereof, said plural output switching transistors are turned on by group in an ascending order of the number of output switching transistors belonging to each group, and in the off operation thereof, said plural output switching transistors are turned off by group in a descending order of the number of output switching transistors belonging to each group.

Signed and Sealed this

Twenty-second Day of April, 2003

JAMES E. ROGAN
*Director of the United States Patent and Trademark Office*